United States Patent
Agustsson et al.

(10) Patent No.: US 12,267,089 B2
(45) Date of Patent: Apr. 1, 2025

(54) SYSTEMS AND METHODS FOR IMPROVED MACHINE-LEARNED COMPRESSION

(71) Applicant: Google LLC, Mountain View, CA (US)

(72) Inventors: Eirikur Thor Agustsson, Zürich (CH); Lucas Marvin Theis, Berlin (DE)

(73) Assignee: GOOGLE LLC, Mountain View, CA (US)

( * ) Notice: Subject to any disclaimer, the term of this patent is extended or adjusted under 35 U.S.C. 154(b) by 93 days.

(21) Appl. No.: 18/008,045

(22) PCT Filed: Jun. 3, 2021

(86) PCT No.: PCT/US2021/035672
§ 371 (c)(1),
(2) Date: Dec. 2, 2022

(87) PCT Pub. No.: WO2021/247840
PCT Pub. Date: Dec. 9, 2021

(65) Prior Publication Data
US 2023/0299788 A1    Sep. 21, 2023

Related U.S. Application Data

(60) Provisional application No. 63/034,172, filed on Jun. 3, 2020.

(51) Int. Cl.
*H03M 7/30* (2006.01)
*G06N 3/0455* (2023.01)
*G06N 3/084* (2023.01)

(52) U.S. Cl.
CPC ........ *H03M 7/3059* (2013.01); *G06N 3/0455* (2023.01); *G06N 3/084* (2013.01)

(58) Field of Classification Search
CPC ... H03M 7/3059; G06N 3/0455; G06N 3/084; G06N 3/044; G06N 3/045; G06N 3/047; G06N 3/088
See application file for complete search history.

(56) References Cited

U.S. PATENT DOCUMENTS

| 11,544,606 B2 * | 1/2023 | Mandt | ............. G06N 20/00 |
| 2018/0032871 A1 * | 2/2018 | Holt | ............. G06N 3/045 |

(Continued)

OTHER PUBLICATIONS

Agustsson et al., "Generative Adversarial Networks for Extreme Learned Image Compression.", arXiv:1804.02958v3, Aug. 18, 2019, 26 pages.

(Continued)

*Primary Examiner* — Lam T Mai
(74) *Attorney, Agent, or Firm* — DORITY & MANNING P.A.

(57) ABSTRACT

A computer-implemented method for compressing computer-readable data having improved efficiency can include obtaining, by a computing system including one or more computing devices, input data associated with the computing system; and encoding, by the computing system, the input data and added noise from a noisy channel to produce encoded data based at least in part on an encoder model, wherein encoding the input data and added noise includes additively combining the added noise and the input data to obtain noisy input data and rounding the noisy input data by a soft rounding function, the soft rounding function having a sharpness, to produce the encoded data, wherein the machine-learned encoder model is trained on training data, wherein the training data is encoded with the added noise from the noisy channel.

42 Claims, 8 Drawing Sheets

(56) References Cited

U.S. PATENT DOCUMENTS

| | | | |
|---|---|---|---|
| 2018/0357753 A1* | 12/2018 | Lehtinen | G06N 3/045 |
| 2019/0392302 A1* | 12/2019 | Mandt | H03M 7/00 |
| 2020/0090069 A1* | 3/2020 | Mandt | G06N 3/08 |
| 2020/0364603 A1* | 11/2020 | Oktay | G06N 3/08 |
| 2020/0372305 A1* | 11/2020 | Streeter | G06N 3/084 |
| 2021/0357789 A1* | 11/2021 | Pagh | G06N 5/04 |
| 2022/0174328 A1* | 6/2022 | Toderici | G06N 3/088 |
| 2023/0050134 A1* | 2/2023 | Biswas | G06N 3/047 |
| 2023/0099526 A1* | 3/2023 | Chinen | G06F 18/24 382/254 |
| 2023/0186166 A1* | 6/2023 | Oktay | G06N 3/045 706/12 |
| 2024/0176988 A1* | 5/2024 | Martinez Gil | G06N 3/044 |

OTHER PUBLICATIONS

Agustsson et al., "Soft-to-Hard Vector Quantization for End-to-End Learning Compressible Representations.", arXiv:1704.00648v2, Jun. 8, 2017, 16 pages.

Akamai, "State of the Internet Report.", retrieved on Apr. 19, 2023, https://www.akamai.com/newsroom/press- release/akamai-releases-first-quarter-2017-state-of-the-internet-connectivity-report, May 30, 2017, 4 pages.

Balle et al., "End-to-End Optimization of Nonlinear Transform Codes for Perceptual Quality.", arXiv:1607.05006v2, Oct. 17, 2016, 5 pages.

Balle et al., "End-to-End Optimized Image Compression.", arXiv:1611.01704v3, Mar. 3, 2017, 27 pages.

Balle et al., "Variational Image Compression with a Scale Hyperprior.", arXiv:1802.01436v2, May 1, 2016, 23 pages.

Barnett Jr., "Cisco Visual Networking Index.", retrieved on Jan. 17, 2023, https://blogs.cisco.com/sp/2018-complete-vni-forecast-update, Nov. 27, 2018, 6 pages.

Bengio et al., "Estimating or Propagating Gradients Through Stochastic Neurons for Conditional Computation.", arXiv:1308.3432v1, Aug. 15, 2013, 12 pages.

Bennett et al., "Entanglement-Assisted Capacity of a Quantum Channel and the Reverse Shannon Theorem.", arXiv:quant-ph/0106052v2, May 14, 2002, 42 pages.

Choi et al., "Variable Rate Deep Image Compression with a Conditional Autoencoder." arXiv:1909.04802v1, Sep. 11, 2019, 14 pages.

Cover et al., "Capacity of Coordinated Actions.", International Symposium on Information Theory, Nice, France, Jun. 24-30, 2007, pp. 2701-2705.

Cuff, "Communication Requirements for Generating Correlated Random Variables.", International Symposium on Information Theory, Toronto, Ontario, Canada, Jul. 7-12, 2008, pp. 1393-1397.

Cuff et al., "The Likelihood Encoder for Source Coding.", Information Theory Workshop (ITW), Seville, Spain, 2013, pp. 1-2.

Flamich et al., "Compressing Images by Encoding Their Latent Representations with Relative Entropy Coding.", 24 pages.

Harsha et al., "The Communication Complexity of Correlation.", Institute of Electrical and Electronics Engineers Transactions on Information Theory, vol. 56, No. 1, Jan. 2010, pp. 438-449.

Havasi et al., "Minimal Random Code Learning: Getting Bits Back from Compressed Model Parameters.", arXiv:1810.00440v1, Sep. 30, 2018, 11 pages.

International Telecommunication Union, "Information Technology— Digital Compression and Coding of Continuous-Tone Still Images— Requirements and Guidelines.", retrieved on Apr. 19, 2023, chrome-extension://efaidnbmnnnibpcajpcglclefindmkaj/https://www.w3.org/Graphics/JPEG/itu-181.pdf, Sep. 1992, 186 pages.

Kingma et al., "Adam: A Method for Stochastic Optimization.", arXiv:1412.6980v9, Jan. 30, 2017, 15 pages.

Kingma et al., "Auto-Encoding Variational Bayes.", arXiv:1312.6114v10, May 1, 2014, 14 pages.

Kodak, "Kodak Lossless True Color Image Suite—PhotoCD PCD0992.", retrieved on Jan. 18, 2023, http://r0k.us/graphics/kodak/, Jan. 27, 2013, 3 pages.

Li et al., "Strong Functional Representation Lemma and Applications to Coding Theorems.", rXiv:1701.02827v4, Jan. 19, 2018, 15 pages.

Long et al., "Restricted Boltzmann Machines are Hard to Approximately Evaluate or Simulate.", Twenty-seventh International Conference on Machine Learning, Haifa, Israel, Jun. 21-24, 2010, 8 pages.

Minnen et al., "Joint Autoregressive and Hierarchical Priors for Learned Image Compression.", arXiv:1809,02736v1, Sep. 8, 2018, 22 pages.

Qin et al., "Scale Mixture Models with Applications to Bayesian Inference.", American Institute of Physics Conference Proceedings, Los Alamos, New Mexico, United States, vol. 690, No. 1, Jun. 9-11, 2003, pp. 394-395.

Rezende et al., "Stochastic Backpropagation and Approximate Inference in Deep Generative Models.", arXiv:1401.4082v3, May 30, 2014, 14 pages.

Rippel et al., "Real-Time Adaptive Image Compression.", arXiv:1705.05823v1, May 16, 2017, 16 pages.

Roberts, "Picture Coding Using Pseudo-Random Noise.", IRE Transactions on Information Theory, vol. 8, No. 2, pp. 145-154, Feb. 1962, 10 pages.

Saxe et al., "Exact Solutions to the Nonlinear Dynamics of Learning in Deep Linear Neural Networks.", arXiv:1312.6120v3, Feb. 19, 2014, 22 pages.

Schuchman, "Dither Signals and Their Effect on Quantization Noise.", Communication Technology, vol. 12, No. 4, Dec. 1964, pp. 162-165.

Smolensky, "Information Processing in Dynamical Systems: Foundations of Harmony Theory.", Parallel Distributed Processing, vol. 1, MIT Press, Cambridge, pp. 194-281.

Theis et al., "Lossy Image Compression with Compressive Autoencoders.", arXiv:1703.00395v1, Mar. 1, 2017, 19 pages.

Toderici et al., "Variable Rate Image Compression with Recurrent Neural Networks.", arXiv:1511.06085v5, Mar. 1, 2016, 12 pages.

Werbos et al, "Beyond Regression: New Tools for Prediction and Analysis in the Behavioral Sciences.", Harvard University, Cambridge, Massachusetts, United States, 1974, 454 pages.

Zamir et al., "Lattice Coding for Signals and Networks: A Structured Coding Approach to Quantization, Modulation and Multiuser Information Theory.", Cambridge University Press, Aug. 2014, 8 pages.

Zamir et al., "On Universal Quantization by Randomized Uniform/ Lattice Quantizers.", Transactions on Information Theory, vol. 38, No. 2. Mar. 1992, pp. 428-436.

Zhou et al., "Variational Autoencoder for Low Bit-rate Image Compression.", Computer Vision and Pattern Recognition Workshops, Salt Lake City, Utah, United States, Jun. 18-22, 2018, pp. 2617-2620.

Ziv, "On Universal Quantization." Institute of Electrical and Electronics Engineers Transactions on Information Theory, vol. 31, No. 3, May 1985, pp. 344-347.

International Preliminary Report on Patentability for Application No. PCT/US2021/035672, mailed Dec. 15, 2022, 13 pages.

Baskin, et al. "Uniq: Uniform Noise Injection for Non-uniform Quantization of Neural Networks." arXiv:1804.10969v3, Oct. 2, 2018. 10 pages.

Choi, et al. "Universal Deep Neural Network Compression." IEEE, vol. 14, No. 4. Feb. 21, 2019. pp. 715-726.

Fan, et al. "Training with Quantization Noise for Extreme Model Compression." Apr. 17, 2020. https://arxiv.org/pdf/2004.07320v2.pdf. 18 pages.

Gong, et al. "Differentiable Soft Quantization: Bridging Full-Precision and Low-Bit Neural Networks." Oct. 27, 2019. 2019 IEEE/CVF ICCV, pp. 4851-4860.

International Search Report, PCT/US2021/035672 mailed on Nov. 30, 2021, 5 pages.

(56) References Cited

OTHER PUBLICATIONS

Louizos, et al. "Relaxed Quantization for Discretized Neural Networks." arXiv:1810.01875v1. Oct. 3, 2018. 14 pages.

* cited by examiner

SYSTEMS AND METHODS FOR IMPROVED MACHINE-LEARNED COMPRESSION

CROSS-REFERENCE TO RELATED APPLICATIONS

This application is based upon and claims the right of priority under 35 U.S.C. § 371 to International Application No. PCT/US2021/035672 filed on Jun. 3, 2021, which claims the benefit of United States Provisional Patent Application No. 63/034,172 filed on Jun. 3, 2020. Applicant claims priority to and the benefit of each of such applications and incorporate all such applications herein by reference in its entirety.

FIELD

The present disclosure relates generally to data compression, such as end-to-end machine-learned data compression.

BACKGROUND

Reverse channel coding refers to approaches for communicating a sample (e.g., a continuous sample) over a digital channel. One class of general purpose reverse channel coding algorithms generates a large number of samples from a distribution. An index corresponding to a sample having a conditional distribution based on input is then communicated.

Reverse channel coding can be useful for data compression. For instance, computer-readable data can be compressed for storage and/or transmission. Compressed data can have a reduced computing resource requirement for storage and/or transmission over the original data. The compressed data can be decompressed to recreate or approximate the original data.

SUMMARY

Aspects and advantages of embodiments of the present disclosure will be set forth in part in the following description, or can be learned from the description, or can be learned through practice of the embodiments.

One example aspect of the present disclosure is directed to a computer-implemented method for compressing computer-readable data having improved efficiency. The computer-implemented method can include obtaining, by a computing system including one or more computing devices, input data associated with the computing system; and encoding, by the computing system, the input data and added noise from a noisy channel to produce encoded data based at least in part on an encoder model, wherein encoding the input data and added noise includes additively combining the added noise and the input data to obtain noisy input data and rounding the noisy input data by a soft rounding function, the soft rounding function having a sharpness, to produce the encoded data, wherein the machine-learned encoder model is trained on training data, wherein the training data is encoded with the added noise from the noisy channel.

Another example aspect of the present disclosure is directed to a computer-implemented method of decoding encoded data. The computer-implemented method includes obtaining, by a computing system including one or more computing devices, encoded data, the encoded data encoded based at least in part on input data and added noise from a noisy channel, wherein the encoded data is encoded by additively combining the added noise and the input data to obtain noisy input data and rounding the noisy input data by a soft rounding function, the soft rounding function having a sharpness, to produce the encoded data; and applying, by the computing system, a reconstruction defined by an expected value given a smooth universal quantization approximation to reconstruct approximated input data.

Another example aspect of the present disclosure is directed to a computer-implemented method of encoding input data with improved computational and statistical efficiency. The computer-implemented method includes obtaining, by a computing system including one or more computing devices, input data associated with the computing system. The computer-implemented method includes obtaining, by the computing system, data indicative of a target distribution based at least in part on the input data. The computer-implemented method includes determining, by the computing system, a uniform distribution based at least in part on the target distribution. The computer-implemented method includes obtaining, by the computing system, a plurality of samples from the uniform distribution. The computer-implemented method includes identifying, by the computing system, an index corresponding to a selected sample of the plurality of samples from the uniform distribution such that the selected sample is distributed according to the target distribution. The computer-implemented method includes communicating, by the computing system, encoded sample representation data, the encoded sample representation data including the index corresponding to the selected sample and a decoding factor comprising a subtractive combination of the selected sample and a uniform random variable corresponding to the selected sample.

Other aspects of the present disclosure are directed to various systems, apparatuses, non-transitory computer-readable media, user interfaces, and electronic devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

The attached Appendix is incorporated into and forms a portion of this application. The attached Appendix provides details regarding example implementations of the systems and methods described herein. The systems and methods of the present disclosure are not limited to the specific example implementations included in the Appendix.

BRIEF DESCRIPTION OF THE DRAWINGS

Detailed discussion of embodiments directed to one of ordinary skill in the art can be set forth in the specification, which makes reference to the appended figures, in which.

DETAILED DESCRIPTION

Overview

Figure 1A:
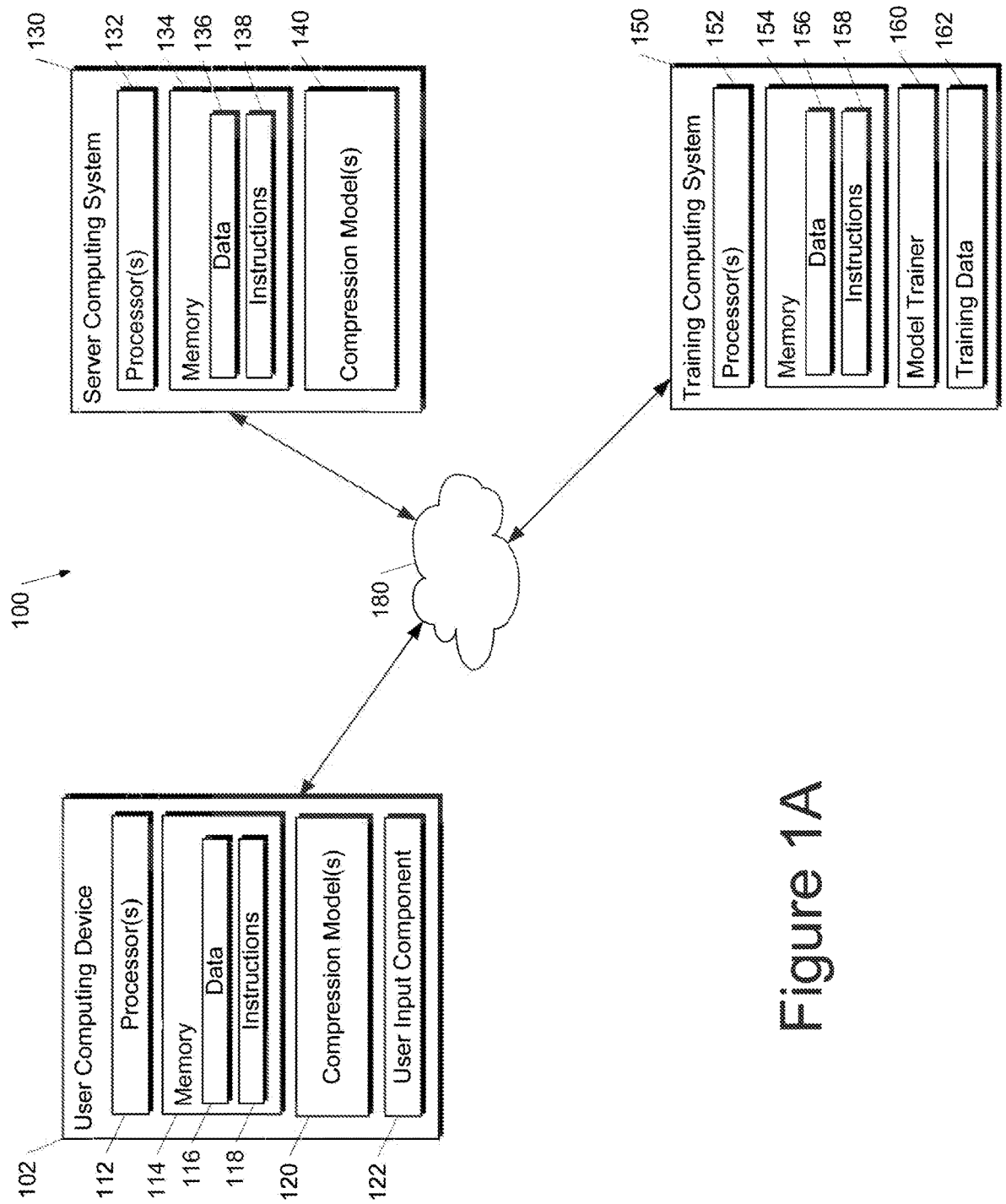
FIG. 1A depicts a block diagram of an example computing system according to example embodiments of the present disclosure.

Example aspects of the present disclosure are directed to systems and methods that can compress data (e.g., images, tensors, etc.) to reduce an amount of stored and/or transmitted data needed to retain information. As one example, the data can be image data (e.g., RGB image data, CYMB image data, etc.). One example approach to compressing data can be to employ one or more machine-learned models, such as neural networks, convolutional neural networks, recurrent neural networks, recursive neural networks, etc., to compress, decompress, store, and/or transmit data. For instance, one or more machine-learned models can be employed in an encoder and/or a decoder. The encoder can receive input data and, in response to receipt of the input data, produce encoded data according to an encoding scheme. The encoded data can be stored and/or transmitted (e.g., through or over a channel) to a decoder. The decoder can receive the encoded data and, in response to receipt of the encoded data, produce output data that at least closely approximates the input data and/or is identical to the input data.

The encoder and/or decoder can be trained (e.g., by unsupervised training) based on a loss that grades a difference between the input data and output data, with the intent of minimizing the difference during training. For instance, one example approach to end-to-end trained lossy compression optimizes a rate distortion loss of the form:

$$-\log_2 P(\lfloor f(x) \rceil) + \lambda d(x, g(\lfloor f(x) \rceil)).$$

where f is an encoder, g is a decoder, P is a probability mass function, and $\lfloor \cdot \rceil$ is a function used for quantization, such as, for example, a rounding function. A distortion d measures the discrepancy between reconstructions and inputs.

More particularly, information can be stored in a computing system as data. Data can represent lexical, numerical, or other suitable types of information in a format that is capable of being processed and/or otherwise interpreted by a computing system. For example, data can be represented as a collection of numerals (e.g., bits) in a memory device. Example memory devices include, but are not limited to, non-transitory computer-readable storage mediums, such as RAM, ROM, EEPROM, EPROM, flash memory devices, magnetic disks, etc., and combinations thereof.

It can be desirable to reduce the amount of memory and/or other computing resources used to store and/or transmit the information. For instance, it can be desirable to reduce the size of the data used to store the information. As another example, it can be desirable to reduce a number of bits that must be transmitted to completely transmit the information in the data. Techniques for reducing the size of data are referred to as data compression techniques. Lossless compression refers to compression techniques that allow data to be compressed and subsequently decompressed with no loss of information. Lossy compression refers to compression techniques that introduce unrecoverable error into the data after compression and/or decompression, resulting in information loss. For example, lossy compression techniques can slightly increase and/or decrease numerical values represented by the data. As another example, lossy compression techniques can result in a loss in precision associated with the data. As another example, lossy compression techniques can introduce blur or other distortion into an image.

Although it can be desirable to reduce or eliminate information loss, lossy compression can allow for a significant decrease in the size of the data compared to lossless compression, such that some applications can opt to use lossy compression over lossless compression. For example, in many cases the error introduced by lossy compression does not significantly impact a function of the data. Despite this, it can still be desirable to reduce an error associated with lossy compression while at least partially maintaining improved compression size from the lossy compression.

Deep learning (e.g., machine-learned, such as by one or more machine-learned models) research into lossy compression (e.g., image compression) has seen tremendous progress. End-to-end trained neural networks have improved to sometimes outperform even the best manually designed compression schemes. However, computational complexity, temporal inconsistencies, and perceptual metrics which are effective yet easy to optimize still present challenges to deep learning approaches, such as neural networks. Practical lossy compression schemes can rely on quantization to compute a discrete representation which can be transmitted digitally. Quantization is a non-differentiable operation and as such can prevent from optimizing encoders directly via backpropagation. Thus, it is often desirable to perform approximate quantization to approximate so-called "hard" quantization.

One approach is to approximate quantization is to replace hard quantization with a differentiable approximation during training but to use hard quantization at test time. However, this creates a mismatch between training and test time and may negatively impact performance. Another alternative is to get rid of quantization altogether. For instance, systems and methods can communicate information in a differentiable manner both at training and at test time. At the heart of this approach is the insight that a sample from a possibly continuous distribution can be communicated using a finite number of bits. This is known as the reverse Shannon theorem. However, some existing realizations of this approach tend to be either computationally costly or statistically inefficient. For instance, they can require more bits than they transmit information.

Some example aspects of the present disclosure bridge the gap between the two approaches of dealing with quantization. According to example aspects of the present disclosure, one approach to learning encoders for compression (e.g., lossy compression) can be to use additive noise (e.g., uniform noise) during training. The noise can be an approximation to test-time quantization. A uniform noise channel can also be implemented at test time using universal quantization. This can eliminate any mismatch between training and test phases while maintaining a completely differentiable loss function. Implementing the uniform noise channel can be a special case of a more general problem to communicate a sample, which can be computationally hard without assumptions about its distribution. The uniform noise special case can be efficient as well as easy to implement and thus especially beneficial from a practical viewpoint. Finally, quantization can be obtained as a limiting case of a soft quantizer applied to the uniform noise channel, bridging compression with and without quantization.

Some other example aspects of the present disclosure can provide for communicating a sample from a distribution which is not necessarily a uniform distribution (e.g., in which the noise is not necessarily uniform noise). For instance, some example aspects of the present disclosure can be directed to a hybrid algorithm that can transmit samples from arbitrary smooth target distributions with improved computational efficiency, especially in cases when most of the relevant information to be transmitted is contained in a support of the target distribution. According to example aspects of the present disclosure, a plurality of candidate samples can be drawn from a uniform distribution with the same or larger support as a target distribution. An index corresponding to a selected sample of the plurality of candidate samples can be identified (e.g., by a reverse channel coding algorithm) such that the selected sample has the target distribution. Because the uniform distribution is related to the target distribution (e.g., by having an equivalent or greater support), this can provide for a reduced number of candidate samples than applying reverse channel coding directly to candidate samples drawn from a fixed distribution. The uniform distribution and the candidate samples drawn from it are not known to the receiver which only has access to a fixed distribution. However, if the candidate samples are generated using universal quantization as described herein, the candidate samples can be reconstructed at the receiver based at least in part on a rounded subtractive combination of input data and the selected sample, which is transmitted to the receiver along with the index.

Systems and/or methods according to example aspects of the present disclosure can achieve a variety of technical effects and/or benefits, including, for example, improvements to computing technology. As one example, example aspects of the present disclosure can provide an improved compression scheme for computer-readable data. The improved compression scheme can have, for example, reduced error between input data and output data, greater compression characteristics (e.g., data reduction), greater reliability and/or robustness, improved depiction of noise, and/or various other advantages. Improved image and video data compression provided by example aspects of the present disclosure can improve worldwide distribution and/or proliferation of videos, images, and other media.

One method for approximating quantization is to replace (e.g., hard) rounding with uniform noise during training. As used herein, so-called "hard" rounding refers to rounding with discrete, discontinuous rounding thresholds (e.g., a rounding function wherein every number less than a threshold, such as a midpoint between intervals, is rounded down to the nearest interval and other numbers are rounded up to the nearest interval). Unlike some other approaches to quantization free compression, this noisy channel can be easy to implement in a way which is statistically and computationally efficient for both small and large amounts of information. One example channel is a uniform noise channel, represented by:

$z=f(x)+U$, $U\sim U([-0.5, 0.5)^D)$.

According to example aspects of the present disclosure, this noise is recognized as a form of compression without quantization (e.g., as opposed to a simple approximation). The uniform noise channel turns out to be easy to simulate efficiently using a noisy channel, both from a computational and a statistical perspective. This makes it feasible to use at test time with both low- and high-dimensional sets of coefficients. It can be possible to smoothly interpolate between uniform noise and hard quantization while maintaining differentiability.

It can further be possible according to example aspects of the present disclosure to integrate out uniform noise analytically when calculating gradients, and in some cases drastically reduce their variance. The better match between training and test phases can lead to improved performance even in settings where hard quantization is known to be optimal.

Instead of approximating quantization or relying on straight-through gradient estimates during training, systems and methods according to example aspects of the present disclosure can employ a differentiable channel and thus eliminate any need for approximations. Techniques to simulate a noisy channel, $q(z|x)$, can require generating on the order of $\exp D_{KL}[q_{Z|x}\|p_Z]$ samples $z_n\sim p_Z$ for every input vector x to be communicated. The encoder selects a single sample and communicates its index, n, which the decoder then uses to reconstruct the sample.

Since the mutual information $I[X, Z]$ is a lower bound on the average Kullback-Leibler divergence, a tradeoff is observed. It is desirable to keep the divergence small to limit the computational cost, such as, for example, by encoding blocks of coefficients separately. However, the information transmitted is desirably large enough to keep the statistical overhead small.

In addition to and/or alternatively to uniform noise, other types of noise can be added in accordance with example aspects of the present disclosure. While the approach with uniform noise can be statistically and computationally efficient, it may only allow to communicate samples from a simple uniform distribution.

One approach to including other noise can be a generalization to lattice quantizers. Let $\Lambda$ be a lattice and $Q_\Lambda(y)$ be the nearest neighbor of y in the lattice. Further let V be a Voronoi cell of the lattice and $U\sim U(V)$ be a random vector which is uniformly distributed over the Voronoi cell. Then the channel can be represented by:

$Q_\Lambda(y-U)+U\sim y+U$.

For certain lattices and in high dimensional spaces, U will be distributed approximately like a Gaussian. Thus, universal quantization can be used to approximately simulate an additive white Gaussian noise channel.

Another approach to obtaining Gaussian noise is described as follows. Let S be a positive random variable independent of Y and $U\sim U([-0.5,0.5))$ S and U are known to both the encoder and the decoder. Then, for another uniform random variable U':

$(\lfloor y/S-U\rfloor+U)\cdot S\sim y+SU'$

If $G\sim\Gamma\left(\frac{3}{2},\frac{1}{2}\right)$ and $S=2\sigma\sqrt{G}$, then SU' has a Gaussian distribution with variance $\sigma^2$. More generally, this approach can allow system according to the present disclosure to implement any noise which can be represented as a uniform scale mixture. However, the average number of bits required for transmitting $K=\lfloor y/S-U \rceil$ can be shown to be:

$$H[K|U, S]=I[Y, (Z, S)] \geq I[Y, Z]$$

where $Z=Y+SU'$. If $(Z, S)$ is the data to be transmitted, then only as many bits as transmitted information are used.

According to example aspects of the present disclosure, universal quantization can be employed at an inference stage to implement a noisy channel used during a training stage and thus provide improved compression characteristics. For a given $y \in \mathbb{R}$, universal quantization is quantization with a random offset, $Z=\lfloor y-U \rceil+U$, $U\sim U([-0.5, 0.5))$. Universal quantization has the property of being equal in distribution to adding uniform noise directly. That is, $\lfloor y-U \rceil+U \sim y+U'$, where U' is another source of identical uniform noise. This property makes universal quantization a useful tool for studying hard quantization, especially in settings where quantization noise $y-\lfloor y \rceil$ is roughly uniform. According to example aspects of the present disclosure, beyond being used as an approximation for hard quantization, universal quantization can simulate a differentiable channel for communicating information. At training time, uniform noise is added. Additionally, at deployment, universal quantization is used (e.g., instead of switching to hard quantization), thereby eliminating the mismatch between training and test phases.

For a given coefficient y, the encoder can calculate discrete $K=\lfloor y-U \rceil$ and transmit it to the decoder. The decoder can have access to U and add it back. The conditional entropy of K given U is $H[K|U]=I[Z, Y]=h[Y+U]$. Because this bound is equivalent to the differential entropy of $Y+U$, it is differentiable if the density of Y is differentiable. Additionally, the cost of transmitting K is equivalent to the amount of information gained by the decoder. In contrast to some other methods for compression without quantization, the number of bits required is only bounded by the amount of information transmitted. A model $p_Z$ can be used to approximate the distribution of $Z=Y+U$ (from which a model for K given U can easily be derived). This leads to the loss according to the form:

$$\mathbb{E}_{[-\log_2 p(f(x)+U)]}+\lambda \mathbb{E}_{[d(x, g(f(x)+U))]},$$

where p is a density and $U \sim U([-0.5, 0.5)^D)$ is a random vector of uniform noise. If the distortion is a mean-squared error and $\lambda=1$, then this approach can be considered training a variational autoencoder where the encoder distribution is conditionally uniform.

For modeling the rate term in this loss function it can be necessary to model the density $p(f(x)+U)$. The density of $Y+U$ is modeled via the cumulative distribution $c_Y$ of Y as $p_{Y+U}(y)=c_Y(y+0.5)-c_Y(y-0.5)$ (corresponding to convolving $p_Y$ with a unit width box). This can be generalized to model the density of $h(Y)+U$, where h: $\mathbb{R} \to \mathbb{R}$ is an invertible function (such as soft-round) as $c_{h(Y)}=c_Y(h^{-1}(y))$ which gives $p_{h(Y)+U}(y)=c_Y(h^{-1}(y)+0.5)-c_Y(h^{-1}(y)-0.5)$.

Another advantage of universal quantization over other approximated quantization or quantization-free compression schemes is that it is much more computationally efficient. Its computational complexity grows only linearly with the number of coefficients to be transmitted instead of exponentially with the Kullback-Leibler divergence.

Universal quantization can be applied using the same shift for all coefficients, $U_i=U_j$. This form of universal quantization can be different from adding either identical or independent noise during training. Adding identical noise to different coefficients does not create an information bottleneck, since a single coefficient which is always zero could be used by the decoder to recover the noise and therefore the exact values of the other coefficients. Furthermore, dependent noise can contribute to non-differentiability. Thus, according to example aspects of the present disclosure, in some embodiments, independent noise can be used.

Universal quantization can be made similar to quantization. For instance, applying rounding as the last step of an encoder and again as the first step of a decoder can eliminate the effects of uniform noise $U \sim U([-0.5, 0.5))$, by $\lfloor \lfloor y \rceil + U \rceil = \lfloor y \rceil$. This suggests that some of the benefits of hard quantization can be recovered without sacrificing differentiability by using a smooth approximation to rounding, $s(s(y)+U) \approx \lfloor y \rceil$. For instance, the following function which is differentiable everywhere can be used:

$$s_\alpha(y) = \lfloor y \rceil + \frac{1}{2}\frac{\tanh(\alpha r)}{\tanh(\alpha/2)} + \frac{1}{2}, \text{ where}$$

$$r = y - \lfloor y \rceil - \frac{1}{2}.$$

where the parameter $\alpha$ controls the fidelity of the approximation:

$$\lim_{\alpha \to 0} s_\alpha(y) = y,$$

$$\lim_{\alpha \to \infty} s_\alpha(y) = \lfloor y \rceil.$$

Given $z=s_\alpha(y)+U$, if our goal is to minimize the MSE of y, instead of a second soft rounding, a reconstruction can be obtained with:

$$r_\alpha(s_\alpha(y)+U), \text{ where } r_\alpha(z)=\mathbb{E}[Y|s_{60}(Y)+U=z].$$

Furthermore, the probability $p(y|z) \propto \delta(y \in (s_\alpha^{-1}(z-0.5), s_\alpha^{-1}(z+0.5)])p(y)$, that is, the posterior over y is a truncated version of the prior distribution. If it is assumed that the prior is smooth enough to be approximately uniform in each interval, then:

$$\mathbb{E}[Y|s_\alpha(Y)+U=z] \approx \frac{s_\alpha^{-1}(z-0.5)+s_\alpha^{-1}(z+0.5)}{2} = s_\alpha^{-1}(z-0.5)+0.5.$$

where $s_\alpha(z+1)=s_\alpha(z)+1$. This form is assumed for $r_\alpha$. Note that $$\lim_{\alpha \to \infty} r_\alpha(s_\alpha(y)+U) = \lfloor y \rceil,$$

that is, hard quantization can be recovered as a limiting case. For any finite value of $\alpha$, the loss function remains fully differentiable. Smooth approximations to quantization can be used without the addition of noise. Soft rounding without noise may not create a bottleneck since the function is invertible and the input coefficients can be fully recovered by the decoder.

When $\alpha$ is large, the derivatives of $s_\alpha$ and $r_\alpha$ tend to be close to zero with high probability and very large with low probability. This leads to gradients for the encoder with potentially large variance. To compensate for this, it can be possible to analytically integrate out the uniform noise as follows.

Let h: $\mathbb{R} \to \mathbb{R}$ be a differentiable function and, as before, let $U \sim U([-0.5,0.5))$ be a uniform random variable. The following derivative is a useful computation:

$$\frac{d}{dy}\mathbb{E}[h(y+U)] = \mathbb{E}\left[\frac{d}{dy}h(y+U)\right].$$

To get a low-variance estimate of the expectation's derivative one could average over many samples of U. However, the following equation also holds:

$$\frac{d}{dy}\mathbb{E}[h(y+U)] = \frac{d}{dy}\int_{y-0.5}^{y+0.5} h(y+u)du = h(y+0.5) - h(y-0.5).$$

that is, the gradient of the expectation can be computed analytically with finite differences. Furthermore, this equation can be used to evaluate the derivative of the expectation even when f is not differentiable.

Now consider the case where h is applied pointwise to a vector y+U with $U \sim U([-0.5, 0.5)^D)$ followed by a multi-variable function $\ell: \mathbb{R}^D \to \mathbb{R}$. Then, the following holds:

$$\frac{\partial}{\partial y_i}\mathbb{E}_U[\ell(h(y+U))] = \mathbb{E}_U\left[\frac{\partial}{\partial z_i}\ell(z)|_{z=h(y+U)} \cdot \frac{\partial}{\partial y_i}h(y_i+U_i)\right] \approx$$

$$\mathbb{E}_U\left[\frac{\partial}{\partial z_i}\ell(z)|_{z=h(y+U)}\right] \cdot \mathbb{E}_{U_i}\left[\frac{\partial}{\partial y_i}h(y_i+U_i)\right] =$$

$$\mathbb{E}_U\left[\frac{\partial}{\partial z_i}\ell(z)|_{z=h(y+U)}\right] \cdot (h(y_i+0.5) - h(y_i-0.5)),$$

where the approximation in the third equation is obtained by assuming the partial derivative $$\frac{\partial}{\partial z_i}\ell(z)$$

is independent of $$\frac{\partial}{\partial y_i}f(y_i+U_i).$$

This would hold, tor example, if $\ell(z)$ were locally linear in the region $\{h(y+u): u \in [-0.5, 0.5)^D\}$ so that its derivative is the same for any possible perturbation.

Thus, aspects of the present disclosure can allow for reducing the variance of gradients during backpropagation by the following method: the forward pass can computed in a standard manner (e.g., evaluating $\ell$(h(y+u)) for a sampled instance u), but in the backward pass the derivative $$\frac{\partial}{\partial y_i}h(y_i+u_i)$$

can be replaced with its expected value, $f(y_i+0.5) - f(y_i-0.5)$.

Consider a model where soft-rounding follows the encoder, $y=s_\alpha(f(x))$, and a factorial entropy model is used. The rate-distortion loss becomes:

$$-\Sigma_i \mathbb{E}_{[\log_2 p_i(y_i+U_i)]} + \lambda \mathbb{E}_{[d(x, g(r_\alpha(y+U)))]}.$$

This equation can be applied directly to the rate term to calculate the gradient of y without making any approximations. For the distortion term we use $$\mathbb{E}_U\left[\frac{\partial}{\partial z_i}\ell(z)|_{z=h(y+U)}\right].$$

$(h(y_i+0.5) - h(y_i-0.5))$ where $r_\alpha$ takes the role of h. Interestingly, for the soft-rounding function the expected derivative takes the simple form of a straight-through gradient estimate. For instance, the expected derivative can always be 1.

As used herein, various notation can indicate various mathematical functions and elements. For instance, Z denotes a continuous random vector. Z denotes a continuous random variable. K denotes a discrete random variable. z denotes a scalar observation. z denotes a vector observation. $p_Z(z)$ denotes a continuous probability density function. $P_K(k)=Pr(K=k)$ denotes a discrete probability mass function. H[K] denotes a discrete entropy. h[Z] denotes a differential entropy. $\mathbb{E}[Z]$ denotes an expectation. $D_{KL}[q_{Z|x}\|p_Z]$ denotes a Kullback-Leibler (KL) divergence.

Furthermore, some example aspects of the present disclosure can provide for communicating a sample from an arbitrary continuous distribution across a channel. For instance, example aspects of the present disclosure can provide for a computer-implemented method of encoding input data with improved computational and statistical efficiency. The method can include obtaining, by a computing system including one or more computing devices input data associated with the computing system. For instance, the input data can be data to be compressed.

The method can include obtaining, by the computing system, data indicative of a target distribution based at least in part on the input data. For instance, the target distribution can be a conditional distribution based on the input data. The method can additionally include determining, by the computing system, a uniform distribution based at least in part on the target distribution. For instance, the uniform distribution can have at least the support of the target distribution. As an example, the support can be defined by a range from a minimum to a maximum. The support of the uniform distribution can have at least one or both of a minimum that is lower than a minimum of the target distribution and/or a maximum that is higher than a maximum of the target distribution. As one example, the target distribution's support may be limited to the interval [c−0.5, c+0.5) where c is an input. In some implementations, target distributions with different supports may be transformed to have this support, such as by scaling a distribution having finite support until the support is smaller than one, or by approximating distributions having infinite support (e.g., Gaussians) as distributions with finite support (e.g., truncated Gaussians). In some implementations, the target distributions can be approximately Gaussian with a variance of 1 and a random mean. A sample from a truncated Gaussian can be used in place of a sample from a true Gaussian.

The method can include obtaining, by the computing system, a plurality of (e.g., candidate) samples from the uniform distribution. For instance, a plurality of samples can be drawn from the uniform distribution and each sample can be assigned an index.

The method can include identifying, by the computing system, an index corresponding to a selected sample of the plurality of samples from the uniform distribution such that the selected sample is distributed according to the target distribution. For instance, according to example aspects of the present disclosure, the plurality of samples can be scored. As one example, in some implementations, identifying, by the computing system, the index corresponding to the selected sample of the plurality of samples can include iteratively scoring, for at least one sample of the plurality of samples, the sample based at least in part on the target distribution and selecting the sample as the selected sample if a score of the sample is less than or equal to a target score. For instance, the target score can be an exponential sum of the indices of the plurality of samples divided by a maximum value of the target distribution. As one example, if the smallest possible weight is known (or some other target weight), a sample can be selected once the multiplication of the sample's value and the minimum weight exceeds the sample's value multiplied by the ratio of fixed distribution to target distribution for all values (e.g., a bound on a density ratio weight).

The method can include communicating, by the computing system, encoded sample representation data. The encoded sample representation data can include the index corresponding to the selected sample and a decoding factor, the decoding factor comprising a rounded difference between the selected sample and a uniform random variable corresponding to the selected sample. For instance, in some implementations, an encoder and a decoder can have access to a shared source of randomness in the form of uniform random variables $U_n$. Each $U_n$ can correspond to a candidate sample $Z_n$ of the plurality of samples by $Z_n = \lfloor y - U_n \rfloor$, where the brackets correspond to a rounding function. An index $N^*$ can be selected, and the index along with a decoding factor $K^*$ where $K^* = \lfloor y - U_{N^*} \rfloor$ can be communicated to a decoder. The decoder can reconstruct the plurality samples from only the encoded sample representation data by summing the index and the decoding factor. The encoded sample representation data can be efficiently encoded. For instance, the number of bits required to communicate the encoded sample representation data can be bounded by the amount of information transmitted plus a reasonable overhead.

In some cases, the marginal distribution of the uniform distribution may not be guaranteed to be uniform. Thus, in some implementations, the sample may be transformed by replacing the sample with the multiplication of the index and the cumulative density function of the marginal distribution of the sample and a width M, which is ideally large but small enough so that each target distribution's support is bounded by one. The transform can be applied such that the transformed sample is communicated, and the inverse of the sample is applied after decoding to obtain the original sample.

To entropy encode the encoded sample representation data, it can be necessary to know the distributions. In some implementations, an empirical distribution can be used for the index. Additionally and/or alternatively, if the average conditional entropy of the sample is known, the Zipf distribution can be used to achieve the encoding bound. Because the decoder can reconstruct the uniform distribution from the index, the uniform distribution can also be used to encode the decoding factor. In particular, with a single model for the marginal distribution of the sample, it is possible to derive the probabilities for any conditional distribution over the decoding factor. The transformation can additionally make the decoding factor independent of the uniform distribution.

In some cases, it can be desirable to know the minimum weight, or the minimum value of the ratio of the fixed distribution to the target distribution. For instance, the minimum weight can be represented by a value having a smallest ratio of fixed distribution and target distribution. According to systems and methods of the present disclosure, since the reverse channel coding is applied to a target distribution and a uniform distribution, the smallest weight for the purposes of the algorithm can be represented by the multiplication of the minimum weight $w_{min}$ and the width M.

Example Devices and Systems

FIG. 1A depicts a block diagram of an example computing system 100 that performs data compression according to example embodiments of the present disclosure. The system 100 includes a user computing device 102, a server computing system 130, and a training computing system 150 that are communicatively coupled over a network 180.

The user computing device 102 can be any type of computing device, such as, for example, a personal computing device (e.g., laptop or desktop), a mobile computing device (e.g., smartphone or tablet), a gaming console or controller, a wearable computing device, an embedded computing device, or any other type of computing device.

The user computing device 102 includes one or more processors 112 and a memory 114. The one or more processors 112 can be any suitable processing device (e.g., a processor core, a microprocessor, an ASIC, a FPGA, a controller, a microcontroller, etc.) and can be one processor or a plurality of processors that are operatively connected. The memory 114 can include one or more non-transitory computer-readable storage mediums, such as RAM, ROM, EEPROM, EPROM, flash memory devices, magnetic disks, etc., and combinations thereof. The memory 114 can store data 116 and instructions 118 which are executed by the processor 112 to cause the user computing device 102 to perform operations.

In some implementations, the user computing device 102 can store or include one or more compression models 120. For example, the compression models 120 can be or can otherwise include various machine-learned models such as neural networks (e.g., deep neural networks) or other types of machine-learned models, including non-linear models and/or linear models. Neural networks can include feed-forward neural networks, recurrent neural networks (e.g., long short-term memory recurrent neural networks), convolutional neural networks or other forms of neural networks. Example compression models 120 are discussed with reference to FIGS. 2-4.

In some implementations, the one or more compression models 120 can be received from the server computing system 130 over network 180, stored in the user computing device memory 114, and then used or otherwise implemented by the one or more processors 112. In some implementations, the user computing device 102 can implement multiple parallel instances of a single compression model 120 (e.g., to perform parallel compression across multiple instances of compression services).

More particularly, the compression models 120 can include one or more of an encoder and/or a decoder model. The encoder model can be configured to receive input data and, in response to receipt of the input data, produce encoded data that is transmitted to a decoder model (e.g., at user computing device 102, server computing system 130 (e.g., models 140), another user computing device 102, and/or at any other suitable location). The decoder model can be configured to receive encoded data and, in response to receipt of the encoded data, produce output data (e.g., decoded data) that closely approximates and/or replicates the input data. For example, the computing system 100 can be configured for upload (e.g., encoder at user computing device 102 and/or decoder at server computing system 130) and/or download (e.g., decoder at user computing device 102 and/or encoder at server computing system 130).

According to example aspects of the present disclosure, a noisy channel can be used to introduce noise at the encoded data during training time and test time to eliminate the mismatch between training time and test time. For example, the noisy channel can include uniform noise, gaussian noise, etc.

Additionally or alternatively, one or more compression models 140 can be included in or otherwise stored and implemented by the server computing system 130 that communicates with the user computing device 102 according to a client-server relationship. For example, the compression models 140 can be implemented by the server computing system 140 as a portion of a web service (e.g., a compressed data transmission service). Thus, one or more models 120 can be stored and implemented at the user computing device 102 and/or one or more models 140 can be stored and implemented at the server computing system 130.

The user computing device 102 can also include one or more user input component 122 that receives user input. For example, the user input component 122 can be a touch-sensitive component (e.g., a touch-sensitive display screen or a touch pad) that is sensitive to the touch of a user input object (e.g., a finger or a stylus). The touch-sensitive component can serve to implement a virtual keyboard. Other example user input components include a microphone, a traditional keyboard, or other means by which a user can provide user input.

The server computing system 130 includes one or more processors 132 and a memory 134. The one or more processors 132 can be any suitable processing device (e.g., a processor core, a microprocessor, an ASIC, a FPGA, a controller, a microcontroller, etc.) and can be one processor or a plurality of processors that are operatively connected. The memory 134 can include one or more non-transitory computer-readable storage mediums, such as RAM, ROM, EEPROM, EPROM, flash memory devices, magnetic disks, etc., and combinations thereof. The memory 134 can store data 136 and instructions 138 which are executed by the processor 132 to cause the server computing system 130 to perform operations.

In some implementations, the server computing system 130 includes or is otherwise implemented by one or more server computing devices. In instances in which the server computing system 130 includes plural server computing devices, such server computing devices can operate according to sequential computing architectures, parallel computing architectures, or some combination thereof.

As described above, the server computing system 130 can store or otherwise include one or more machine-learned compression models 140. For example, the models 140 can be or can otherwise include various machine-learned models. Example machine-learned models include neural networks or other multi-layer non-linear models. Example neural networks include feed forward neural networks, deep neural networks, recurrent neural networks, and convolutional neural networks. Example models 140 are discussed with reference to FIGS. 2-4.

The user computing device 102 and/or the server computing system 130 can train the models 120 and/or 140 via interaction with the training computing system 150 that is communicatively coupled over the network 180. The training computing system 150 can be separate from the server computing system 130 or can be a portion of the server computing system 130.

The training computing system 150 includes one or more processors 152 and a memory 154. The one or more processors 152 can be any suitable processing device (e.g., a processor core, a microprocessor, an ASIC, a FPGA, a controller, a microcontroller, etc.) and can be one processor or a plurality of processors that are operatively connected. The memory 154 can include one or more non-transitory computer-readable storage mediums, such as RAM, ROM, EEPROM, EPROM, flash memory devices, magnetic disks, etc., and combinations thereof. The memory 154 can store data 156 and instructions 158 which are executed by the processor 152 to cause the training computing system 150 to perform operations. In some implementations, the training computing system 150 includes or is otherwise implemented by one or more server computing devices.

The training computing system 150 can include a model trainer 160 that trains the machine-learned models 120 and/or 140 stored at the user computing device 102 and/or the server computing system 130 using various training or learning techniques, such as, for example, backwards propagation of errors. In some implementations, performing backwards propagation of errors can include performing truncated backpropagation through time. The model trainer 160 can perform a number of generalization techniques (e.g., weight decays, dropouts, etc.) to improve the generalization capability of the models being trained.

In particular, the model trainer 160 can train the compression models 120 and/or 140 based on a set of training data 162. The training data 162 can include, for example, image data, matrix data, or any other suitable data. The training data can be quantized by universal quantization at training time and inference time to eliminate a mismatch between the training time and inference time, according to example aspects of the present disclosure.

In some implementations, if the user has provided consent, the training examples can be provided by the user computing device 102. Thus, in such implementations, the model 120 provided to the user computing device 102 can be trained by the training computing system 150 on user-specific data received from the user computing device 102. In some instances, this process can be referred to as personalizing the model.

The model trainer 160 includes computer logic utilized to provide desired functionality. The model trainer 160 can be implemented in hardware, firmware, and/or software controlling a general purpose processor. For example, in some implementations, the model trainer 160 includes program files stored on a storage device, loaded into a memory and executed by one or more processors. In other implementations, the model trainer 160 includes one or more sets of computer-executable instructions that are stored in a tangible computer-readable storage medium such as RAM hard disk or optical or magnetic media.

The network 180 can be any type of communications network, such as a local area network (e.g., intranet), wide area network (e.g., Internet), or some combination thereof and can include any number of wired or wireless links. In general, communication over the network 180 can be carried via any type of wired and/or wireless connection, using a wide variety of communication protocols (e.g., TCP/IP, HTTP, SMTP, FTP), encodings or formats (e.g., HTML, XML), and/or protection schemes (e.g., VPN, secure HTTP, SSL).

FIG. 1A illustrates one example computing system that can be used to implement the present disclosure. Other computing systems can be used as well. For example, in some implementations, the user computing device 102 can include the model trainer 160 and the training dataset 162. In such implementations, the models 120 can be both trained and used locally at the user computing device 102. In some of such implementations, the user computing device 102 can implement the model trainer 160 to personalize the models 120 based on user-specific data.

Figure 1B:
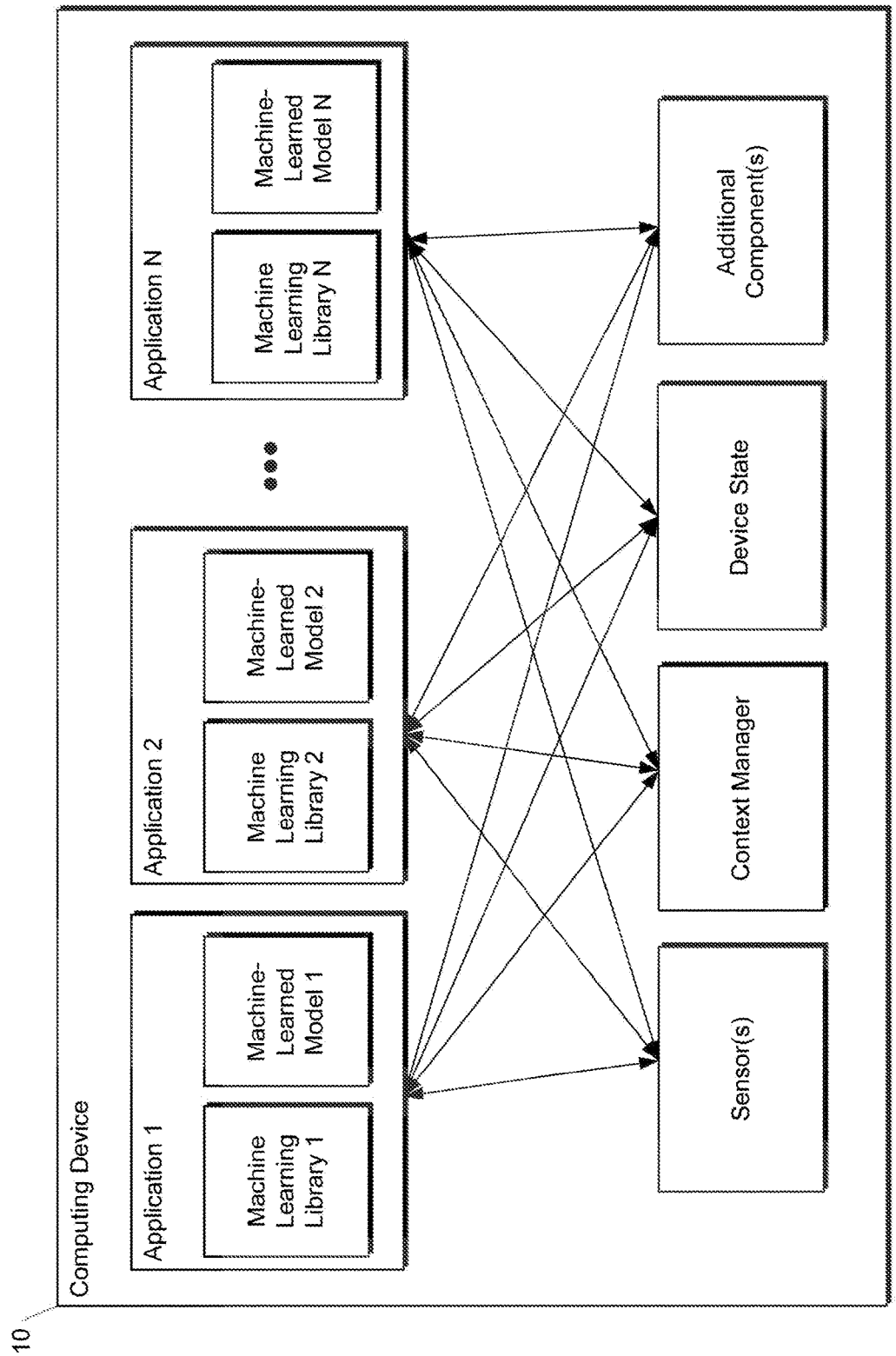
FIG. 1B depicts a block diagram of an example computing device according to example embodiments of the present disclosure.

FIG. 1B depicts a block diagram of an example computing device 10 that performs according to example embodiments of the present disclosure. The computing device 10 can be a user computing device or a server computing device.

The computing device 10 includes a number of applications (e.g., applications 1 through N). Each application contains its own machine learning library and machine-learned model(s). For example, each application can include a machine-learned model. Example applications include a text messaging application, an email application, a dictation application, a virtual keyboard application, a browser application, etc.

As illustrated in FIG. 1B, each application can communicate with a number of other components of the computing device, such as, for example, one or more sensors, a context manager, a device state component, and/or additional components. In some implementations, each application can communicate with each device component using an API (e.g., a public API). In some implementations, the API used by each application is specific to that application.

Figure 1C:
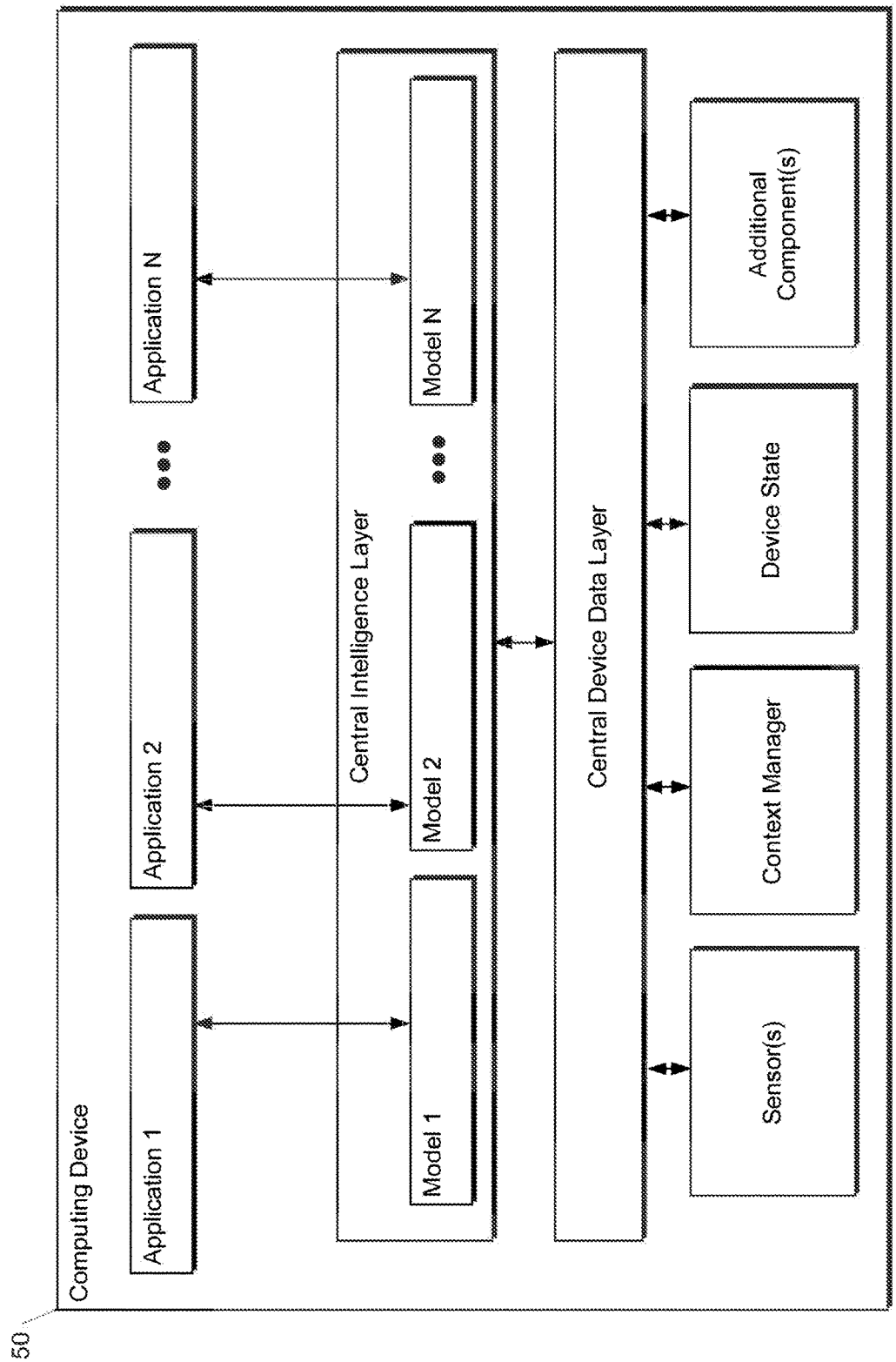
FIG. 1C depicts a block diagram of an example computing device according to example embodiments of the present disclosure.

FIG. 1C depicts a block diagram of an example computing device 50 that performs according to example embodiments of the present disclosure. The computing device 50 can be a user computing device or a server computing device.

The computing device 50 includes a number of applications (e.g., applications 1 through N). Each application is in communication with a central intelligence layer. Example applications include a text messaging application, an email application, a dictation application, a virtual keyboard application, a browser application, etc. In some implementations, each application can communicate with the central intelligence layer (and model(s) stored therein) using an API (e.g., a common API across all applications).

The central intelligence layer includes a number of machine-learned models. For example, as illustrated in FIG. 1C, a respective machine-learned model (e.g., a model) can be provided for each application and managed by the central intelligence layer. In other implementations, two or more applications can share a single machine-learned model. For example, in some implementations, the central intelligence layer can provide a single model (e.g., a single model) for all of the applications. In some implementations, the central intelligence layer is included within or otherwise implemented by an operating system of the computing device 50.

The central intelligence layer can communicate with a central device data layer. The central device data layer can be a centralized repository of data for the computing device 50. As illustrated in FIG. 1C, the central device data layer can communicate with a number of other components of the computing device, such as, for example, one or more sensors, a context manager, a device state component, and/or additional components. In some implementations, the central device data layer can communicate with each device component using an API (e.g., a private API).

In some implementations, the input to the machine-learned model(s) (e.g., 120, 140) of the present disclosure can be image data. The machine-learned model(s) can process the image data to generate an output. As an example, the machine-learned model(s) can process the image data to generate an image recognition output (e.g., a recognition of the image data, a latent embedding of the image data, an encoded representation of the image data, a hash of the image data, etc.). As another example, the machine-learned model(s) can process the image data to generate an image segmentation output. As another example, the machine-learned model(s) can process the image data to generate an image classification output. As another example, the machine-learned model(s) can process the image data to generate an image data modification output (e.g., an alteration of the image data, etc.). As another example, the machine-learned model(s) can process the image data to generate an encoded image data output (e.g., an encoded and/or compressed representation of the image data, etc.). As another example, the machine-learned model(s) can process the image data to generate an upscaled image data output. As another example, the machine-learned model(s) can process the image data to generate a prediction output In some implementations, the input to the machine-learned model(s) of the present disclosure can be text or natural language data. The machine-learned model(s) can process the text or natural language data to generate an output. As an example, the machine-learned model(s) can process the natural language data to generate a language encoding output. As another example, the machine-learned model(s) can process the text or natural language data to generate a latent text embedding output. As another example, the machine-learned model(s) can process the text or natural language data to generate a translation output. As another example, the machine-learned model(s) can process the text or natural language data to generate a classification output. As another example, the machine-learned model(s) can process the text or natural language data to generate a textual segmentation output. As another example, the machine-learned model(s) can process the text or natural language data to generate a semantic intent output. As another example, the machine-learned model(s) can process the text or natural language data to generate an upscaled text or natural language output (e.g., text or natural language data that is higher quality than the input text or natural language, etc.). As another example, the machine-learned model(s) can process the text or natural language data to generate a prediction output.

In some implementations, the input to the machine-learned model(s) of the present disclosure can be speech data. The machine-learned model(s) can process the speech data to generate an output. As an example, the machine-learned model(s) can process the speech data to generate a speech recognition output. As another example, the machine-learned model(s) can process the speech data to generate a speech translation output. As another example, the machine-learned model(s) can process the speech data to generate a latent embedding output. As another example, the machine-learned model(s) can process the speech data to generate an encoded speech output (e.g., an encoded and/or compressed representation of the speech data, etc.). As another example, the machine-learned model(s) can process the speech data to generate an upscaled speech output (e.g., speech data that is higher quality than the input speech data, etc.). As another example, the machine-learned model(s) can process the speech data to generate a textual representation output (e.g., a textual representation of the input speech data, etc.). As another example, the machine-learned model(s) can process the speech data to generate a prediction output.

In some implementations, the input to the machine-learned model(s) of the present disclosure can be latent encoding data (e.g., a latent space representation of an input, etc.). The machine-learned model(s) can process the latent encoding data to generate an output. As an example, the machine-learned model(s) can process the latent encoding data to generate a recognition output. As another example, the machine-learned model(s) can process the latent encoding data to generate a reconstruction output. As another example, the machine-learned model(s) can process the latent encoding data to generate a search output. As another example, the machine-learned model(s) can process the latent encoding data to generate a reclustering output. As another example, the machine-learned model(s) can process the latent encoding data to generate a prediction output.

In some implementations, the input to the machine-learned model(s) of the present disclosure can be statistical data. The machine-learned model(s) can process the statistical data to generate an output. As an example, the machine-learned model(s) can process the statistical data to generate a recognition output. As another example, the machine-learned model(s) can process the statistical data to generate a prediction output. As another example, the machine-learned model(s) can process the statistical data to generate a classification output. As another example, the machine-learned model(s) can process the statistical data to generate a segmentation output. As another example, the machine-learned model(s) can process the statistical data to generate a segmentation output. As another example, the machine-learned model(s) can process the statistical data to generate a visualization output. As another example, the machine-learned model(s) can process the statistical data to generate a diagnostic output.

In some implementations, the input to the machine-learned model(s) of the present disclosure can be sensor data. The machine-learned model(s) can process the sensor data to generate an output. As an example, the machine-learned model(s) can process the sensor data to generate a recognition output. As another example, the machine-learned model(s) can process the sensor data to generate a prediction output. As another example, the machine-learned model(s) can process the sensor data to generate a classification output. As another example, the machine-learned model(s) can process the sensor data to generate a segmentation output. As another example, the machine-learned model(s) can process the sensor data to generate a segmentation output. As another example, the machine-learned model(s) can process the sensor data to generate a visualization output. As another example, the machine-learned model(s) can process the sensor data to generate a diagnostic output. As another example, the machine-learned model(s) can process the sensor data to generate a detection output.

Example Model Arrangements

Figure 2:
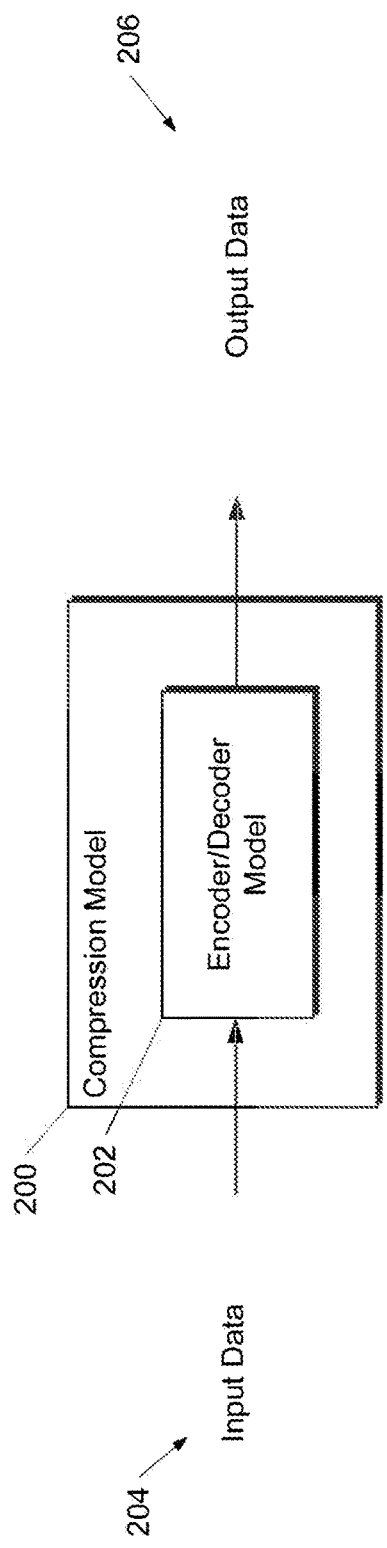
FIG. 2 depicts a block diagram of an example compression model according to example embodiments of the present disclosure.

FIG. 2 depicts a block diagram of an example compression model 200 according to example embodiments of the present disclosure. In some implementations, the compression model 200 is trained to receive a set of input data 204 and, as a result of receipt of the input data 204, provide output data 206 that approximates and/or recreates the input data. Thus, in some implementations, the compression model 200 can include an encoder model and/or a decoder model 202 that is operable to encode and/or decode input data 204 in accordance with example aspects of the present disclosure.

Figure 3:
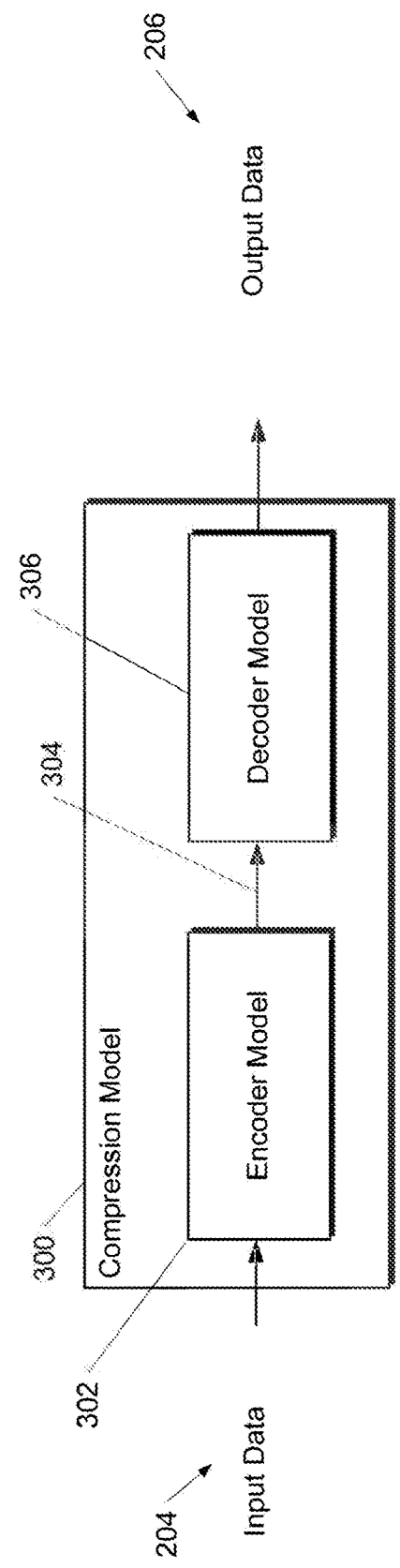
FIG. 3 depicts a block diagram of an example compression model according to example embodiments of the present disclosure.
Figure 4:
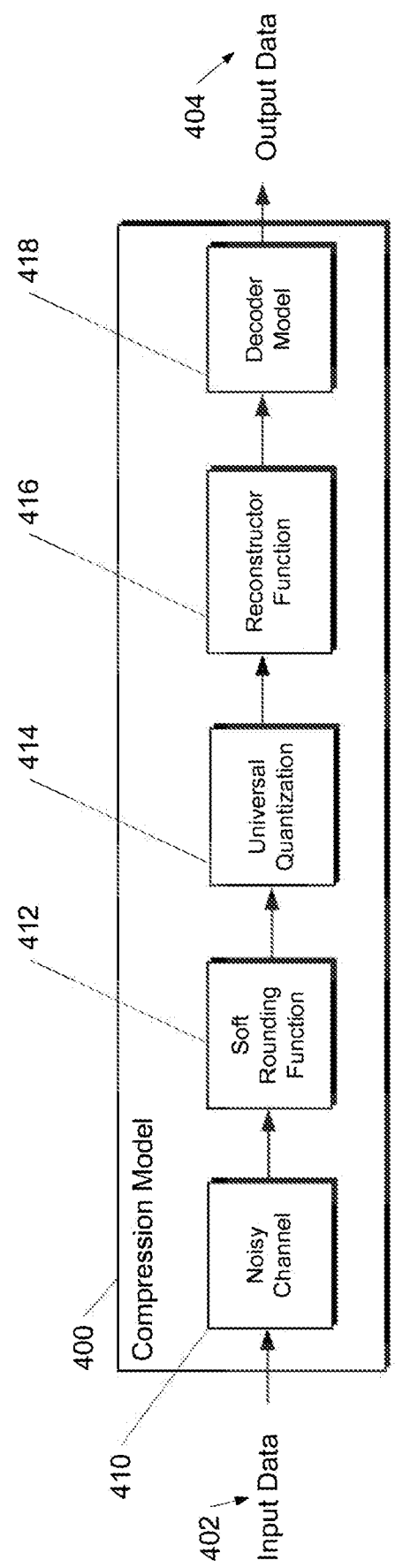
FIG. 4 depicts a block diagram for an example system for compressing data according to example embodiments of the present disclosure.

FIG. 3 depicts a block diagram of an example compression model 300 according to example embodiments of the present disclosure. The compression model 300 is similar to compression model 200 of FIG. 2 except that compression model 300 further includes an encoder model 302 configured to produce encoded data 304 from input data 204 and a decoder model 306 configured to produce output data 206 from encoded date 304. The encoder model 302 and/or decoder model 306 can be FIG. 4 depicts a block diagram of an example compression model 400 according to example embodiments of the present disclosure. The compression model 400 can receive input data 402 and produce output data 404 that approximates the input data 402. The compression model 400 can be distributed among a plurality of computing devices. For example, the noisy channel 410, soft rounding function 412, and/or universal quantization 414 may be applied at a first computing device and/or reconstructor function 416 and/or decoder model 418 can be applied at a second computing device (e.g., remote and/or separate from the first computing device).

The noisy channel 410 can apply noise (e.g., uniform noise) to the input data 402. The soft rounding function 412 can round the input data 402 with applied noise based on a continuous rounding function to produce rounded data. The universal quantization 414 can encode the rounded data for transmission to a decoder model 418. Prior to the decoder model 418, the reconstructor function 416 can reconstruct the encoded data, mitigating the effect of the uniform noise.

Example Methods

Figure 5:
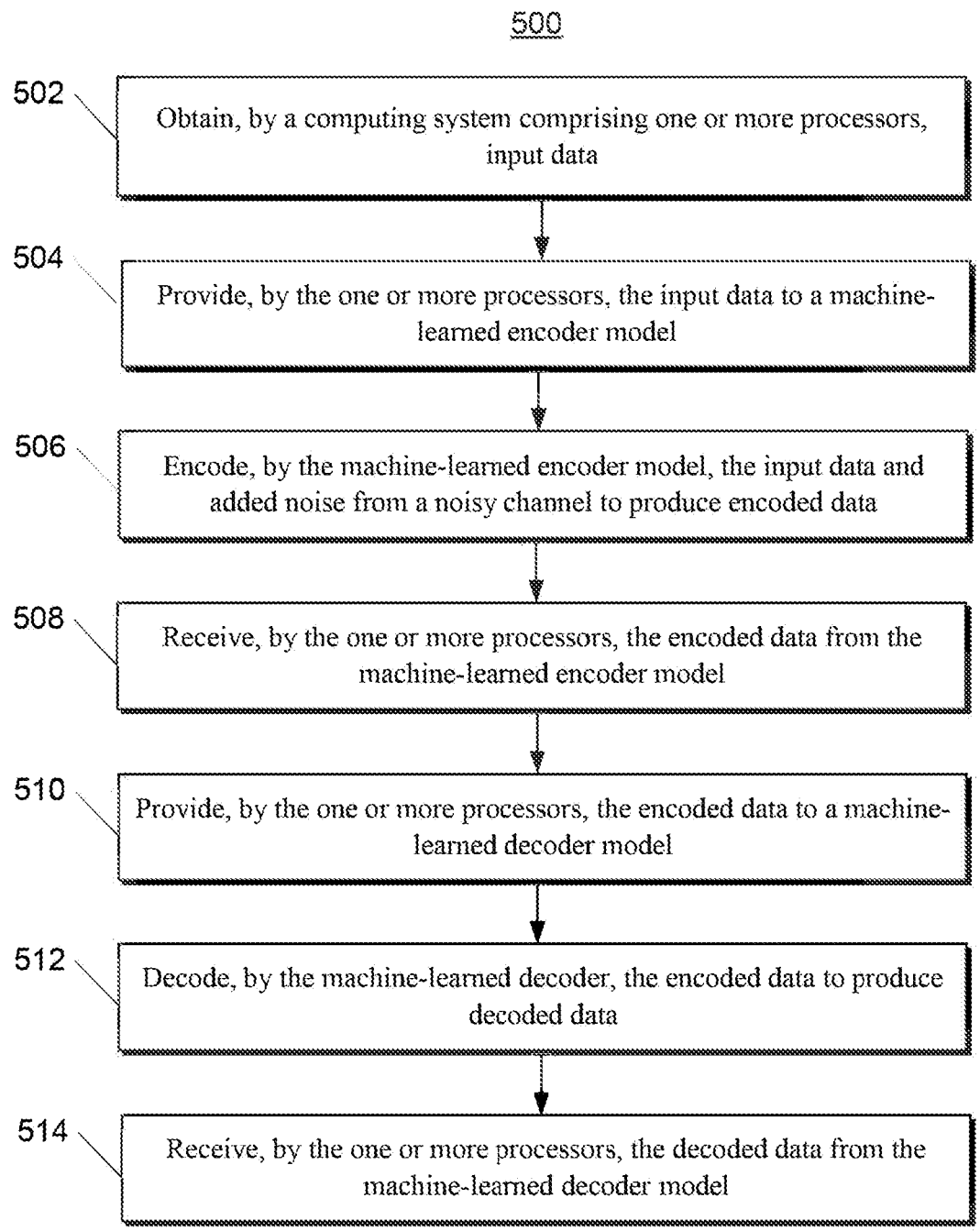
FIG. 5 depicts a flowchart diagram of an example method of data compression according to example embodiments of the present disclosure.

FIG. 5 depicts a flow chart diagram of an example method to perform data compression according to example embodiments of the present disclosure. Although FIG. 5 depicts steps performed in a particular order for purposes of illustration and discussion, the methods of the present disclosure are not limited to the particularly illustrated order or arrangement. The various steps of the method 500 can be omitted, rearranged, combined, and/or adapted in various ways without deviating from the scope of the present disclosure.

At 502, the method 500 can include obtaining, by a computing system including one or more processors, input data. For instance, the input data can be image data.

At 504, the method 500 can include providing, by the one or more processors, the input data to a machine-learned encoder model. For instance, the machine-learned encoder model can include one or more neural networks trained to function as an encoder. The machine-learned encoder model can receive input data and, in response to receipt of the input data, output encoded data as a result.

At 506, the method 500 can include encoding, by the machine-learned encoder model, the input data and added noise from a noisy channel to produce encoded data. For instance, the noisy channel can provide uniform noise, gaussian noise, independent noise, etc. As one example, the machine-learned encoder model can apply quantization, rounding (e.g., soft rounding) or other permutations to encode the input data. For instance, in some embodiments, the encoding can include additively combining the added noise and the input data to obtain noisy input data, rounding the noisy input data by a soft rounding function having a sharpness α to produce rounded data including a set of coefficients, and inputting the rounded data into the machine-learned encoder model to produce the encoded data.

At 508, the method 500 can include receiving, by the one or more processors, the encoded data from the machine-learned encoder model. Additionally, at 510, the method 500 can include providing, by the one or more processors, the encoded data to a machine-learned decoder model. In some embodiments, these steps can be identical. The machine-learned decoder model can receive encoded data and, in response to receipt of the encoded data, provide output data that approximates or replicates the input data. A loss can be defined between the output data and input data.

At 512, the method 500 can include decoding, by the machine-learned decoder, the encoded data to produce decoded data. For instance, the decoder can perform inverse functions to recreate the input data from the encoded data. As one example, the decoder can apply a reconstruction function and/or a soft rounding function to undo the effect of noise on the input data. At 514, the method 500 can include receiving, by the one or more processors, the decoded data from the machine-learned decoder model.

Figure 6:
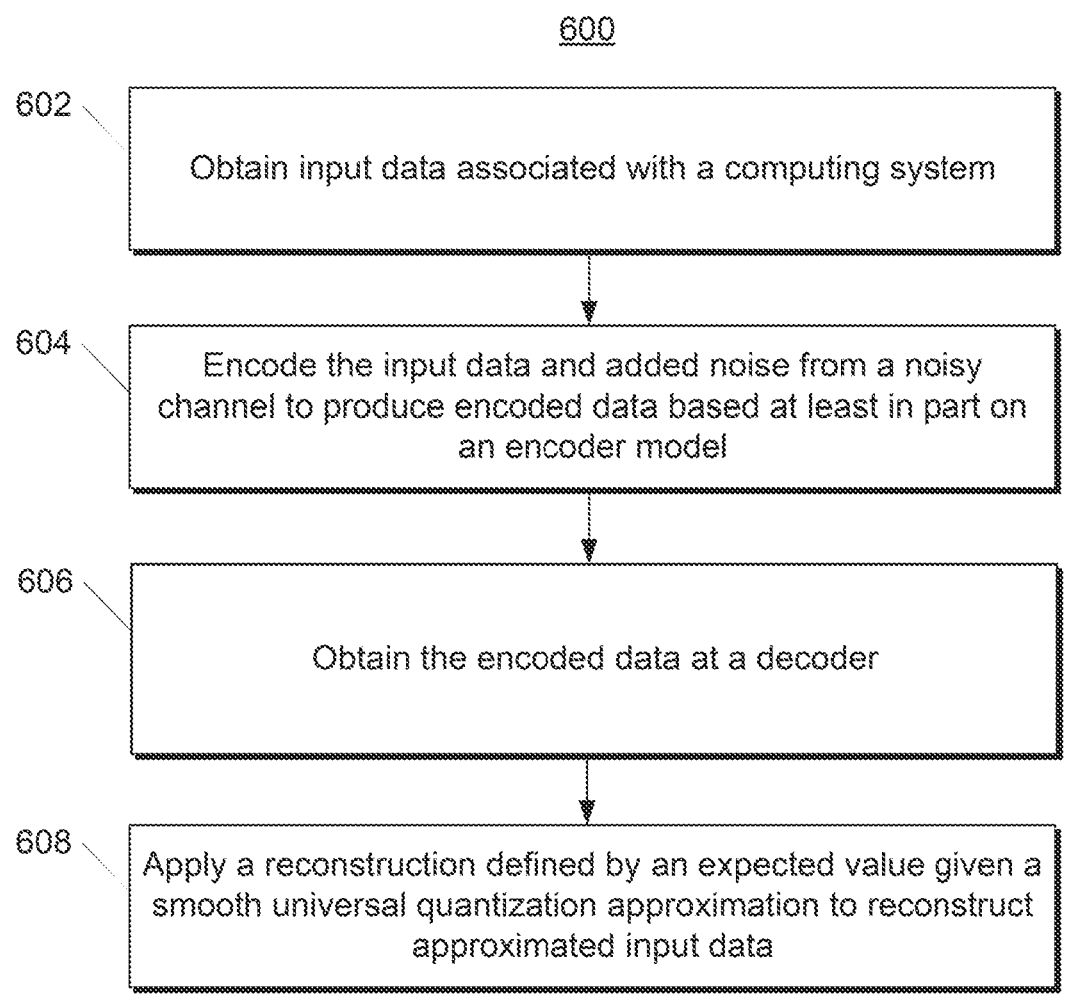
FIG. 6 depicts a flowchart diagram of an example method for compressing computer-readable data having improved efficiency according to example embodiments of the present disclosure.

FIG. 6 depicts a flow chart diagram of an example method to perform data compression according to example embodiments of the present disclosure. Although FIG. 6 depicts steps performed in a particular order for purposes of illustration and discussion, the methods of the present disclosure are not limited to the particularly illustrated order or arrangement. The various steps of the method 600 can be omitted, rearranged, combined, and/or adapted in various ways without deviating from the scope of the present disclosure.

At 602, the method 600 can include obtaining, by a computing system including one or more computing devices, input data associated with the computing system. For instance, the input data can be data to be compressed. At 604, the method 600 can include encoding, by the computing system, the input data and added noise from a noisy channel to produce encoded data based at least in part on an encoder model. For instance, encoding the input data and added noise can include additively combining the added noise and the input data to obtain noisy input data and rounding the noisy input data by a soft rounding function, the soft rounding function having a sharpness, to produce the encoded data. The machine-learned encoder model can be trained on training data, wherein the training data is encoded with the added noise from the noisy channel.

At 606, the method 600 can include obtaining the encoded data. For instance, the encoded data can be communicated from an encoder model (e.g., an encoder computing system) to a decoder model (e.g., a decoder computing system). Additionally and/or alternatively, the encoded data may be stored and later retrieved. The encoded data encoded can be based at least in part on input data and added noise from a noisy channel, wherein the encoded data is encoded by additively combining the added noise and the input data to obtain noisy input data and rounding the noisy input data by a soft rounding function, the soft rounding function having a sharpness, to produce the encoded data.

At 608, the method 600 can include applying, by the computing system, a reconstruction defined by an expected value given a smooth universal quantization approximation to reconstruct approximated input data. In some implementations, a gradient of the approximated input data is computed without any loss by a distortion term including an expected value of a derivative of a loss function. In some implementations, the machine-learned encoder model is trained on training data, wherein the training data is encoded with the added noise from the noisy channel.

Figure 7:
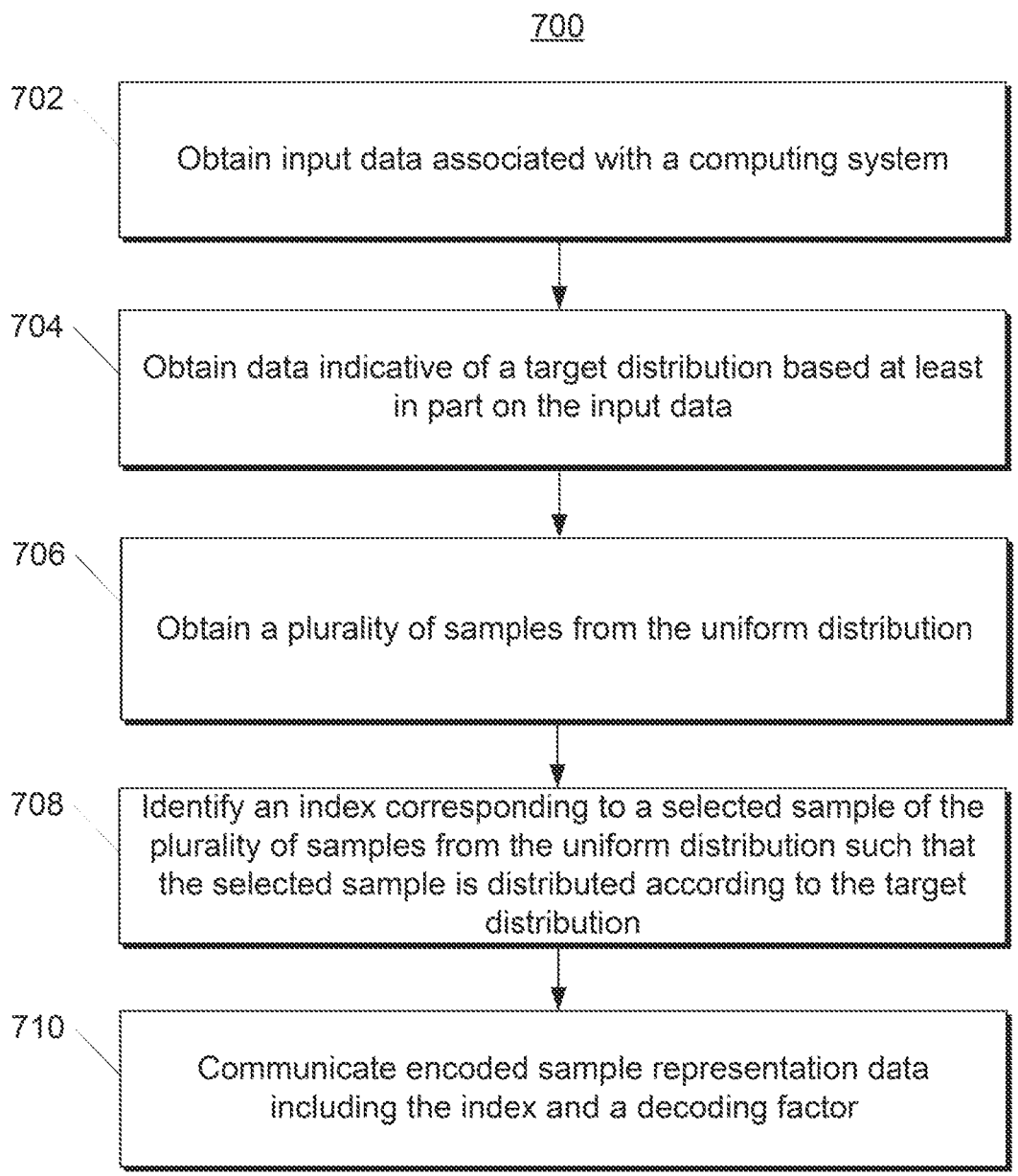
FIG. 7 depicts a flowchart diagram of an example method of encoding input data with improved computational and statistical efficiency according to example embodiments of the present disclosure.

FIG. 7 depicts a flow chart diagram of an example method to perform data compression according to example embodiments of the present disclosure. Although FIG. 7 depicts steps performed in a particular order for purposes of illustration and discussion, the methods of the present disclosure are not limited to the particularly illustrated order or arrangement. The various steps of the method 700 can be omitted, rearranged, combined, and/or adapted in various ways without deviating from the scope of the present disclosure.

At 702, the method 700 can include obtaining, by the computing system, data indicative of a target distribution based at least in part on the input data. For instance, the target distribution can be a conditional distribution based on the input data. At 704, the method 700 can additionally include determining, by the computing system, a uniform distribution based at least in part on the target distribution. For instance, the uniform distribution can have at least the support of the target distribution. As an example, the support can be defined by a range from a minimum to a maximum. The support of the uniform distribution can have at least one or both of a minimum that is lower than a minimum of the target distribution and/or a maximum that is higher than a maximum of the target distribution. As one example, the target distribution's support may be limited to the interval $[c-0.5, c+0.5]$ where c is an input. In some implementations, target distributions with different supports may be transformed to have this support, such as by scaling a distribution having finite support until the support is smaller than one, or by approximating distributions having infinite support (e.g., Gaussians) as distributions with finite support (e.g., truncated Gaussians). In some implementations, the target distributions can be approximately Gaussian with a variance of 1 and a random mean. A sample from a truncated Gaussian can be used in place of a sample from a true Gaussian.

At 706, the method 700 can include obtaining, by the computing system, a plurality of (e.g., candidate) samples from the uniform distribution. For instance, a plurality of samples can be drawn from the uniform distribution and each sample can be assigned an index.

At 708, the method 700 can include identifying, by the computing system, an index corresponding to a selected sample of the plurality of samples from the uniform distribution such that the selected sample is distributed according to the target distribution. For instance, according to example aspects of the present disclosure, the plurality of samples can be scored. As one example, in some implementations, identifying, by the computing system, the index corresponding to the selected sample of the plurality of samples can include iteratively scoring, for at least one sample of the plurality of samples, the sample based at least in part on the target distribution and selecting the sample as the selected sample if a score of the sample is less than or equal to a target score. For instance, the target score can be an exponential sum of the indices of the plurality of samples divided by a maximum value of the target distribution. As one example, if the smallest possible weight is known (or some other target weight), a sample can be selected once the multiplication of the sample's value and the minimum weight exceeds the sample's value multiplied by the ratio of fixed distribution to target distribution for all values (e.g., a bound on a density ratio weight).

At 710, the method 700 can include communicating, by the computing system, encoded sample representation data. The encoded sample representation data can include the index corresponding to the selected sample and a decoding factor, the decoding factor comprising a rounded difference between the selected sample and a uniform random variable corresponding to the selected sample. For instance, in some implementations, an encoder and a decoder can have access to a shared source of randomness in the form of uniform random variables $U_n$. Each $U_n$ can correspond to a candidate sample $Z_n$ of the plurality of samples by $Z_n = \lfloor y - U_n \rceil$, where the brackets correspond to a rounding function. An index N* can be selected, and the index along with a decoding factor K* where $K^* = \lfloor y - U_{N^*} \rceil$ can be communicated to a decoder. The decoder can reconstruct the plurality samples from only the encoded sample representation data by summing the index and the decoding factor. The encoded sample representation data can be efficiently encoded. For instance, the number of bits required to communicate the encoded sample representation data can be bounded by the amount of information transmitted plus a reasonable overhead.

In some cases, the marginal distribution of the uniform distribution may not be guaranteed to be uniform. Thus, in some implementations, the sample may be transformed by replacing the sample with the multiplication of the index and the cumulative density function of the marginal distribution of the sample and a width M, which is ideally large but small enough so that each target distribution's support is bounded by one. The transform can be applied such that the transformed sample is communicated, and the inverse of the sample is applied after decoding to obtain the original sample.

To entropy encode the encoded sample representation data, it can be necessary to know the distributions. In some implementations, an empirical distribution can be used for the index. Additionally and/or alternatively, if the average conditional entropy of the sample is known, the Zipf distribution can be used to achieve the encoding bound. Because the decoder can reconstruct the uniform distribution from the index, the uniform distribution can also be used to encode the decoding factor. In particular, with a single model for the marginal distribution of the sample, it is possible to derive the probabilities for any conditional distribution over the decoding factor. The transformation can additionally make the decoding factor independent of the uniform distribution.

In some cases, it can be desirable to know the minimum weight, or the minimum value of the ratio of the fixed distribution to the target distribution. For instance, the minimum weight can be represented by a value having a smallest ratio of fixed distribution and target distribution. According to systems and methods of the present disclosure, since the reverse channel coding is applied to a target distribution and a uniform distribution, the smallest weight for the purposes of the algorithm can be represented by the multiplication of the minimum weight $w_{min}$ and the width M.

Additional Disclosure

The technology discussed herein makes reference to servers, databases, software applications, and other computer-based systems, as well as actions taken and information sent to and from such systems. The inherent flexibility of computer-based systems allows for a great variety of possible configurations, combinations, and divisions of tasks and functionality between and among components. For instance, processes discussed herein can be implemented using a single device or component or multiple devices or components working in combination. Databases and applications can be implemented on a single system or distributed across multiple systems. Distributed components can operate sequentially or in parallel.

While the present subject matter has been described in detail with respect to various specific example embodiments thereof, each example can be provided by way of explanation, not limitation of the disclosure. Those skilled in the art, upon attaining an understanding of the foregoing, can readily produce alterations to, variations of, and equivalents to such embodiments. Accordingly, the subject disclosure does not preclude inclusion of such modifications, variations and/or additions to the present subject matter as would be readily apparent to one of ordinary skill in the art. For instance, features illustrated or described as part of one embodiment can be used with another embodiment to yield a still further embodiment. Thus, it can be intended that the present disclosure cover such alterations, variations, and equivalents.

What is claimed is:

1. A computer-implemented method for compressing computer-readable data having improved efficiency, the method comprising:
   obtaining, by a computing system comprising one or more computing devices, input data associated with the computing system; and
   encoding, by the computing system, the input data and added noise from a noisy channel to produce encoded data based at least in part on a machine-learned encoder model, wherein encoding the input data and added noise comprises additively combining the added noise and the input data to obtain noisy input data and rounding the noisy input data by a soft rounding function, the soft rounding function having a sharpness, to produce the encoded data;
   wherein the machine-learned encoder model is trained on training data, wherein the training data is encoded with the added noise from the noisy channel.

2. The computer-implemented method of claim 1, wherein the sharpness is progressively increased during training of the machine-learned encoder model.

3. The computer-implemented method of claim 1, wherein the soft rounding function comprises, in response to an input, a sum of a rounded input and a ratio of a hyperbolic tangent of the sharpness multiplied by a quantizing factor to a hyperbolic tangent of half of the sharpness.

4. The computer-implemented method of claim 1, wherein the encoder model comprises one or more neural networks.

5. The computer-implemented method of claim 1, wherein the input data comprises image data.

6. The computer-implemented method of claim 1, wherein the added noise comprises uniform noise.

7. The computer-implemented method of claim 1, wherein the noisy channel is differentiable.

8. The computer-implemented method of claim 1, wherein the noisy input data is quantized by adding uniform noise during training of the machine-learned encoder model and during inference by the machine-learned encoder model by universal quantization.

9. The computer-implemented method of claim 1, wherein the added noise comprises Gaussian noise.

10. The computer-implemented method of claim 1, wherein the noisy channel comprises a lattice quantizer and the added noise comprises lattice quantization noise.

11. The computer-implemented method of claim 1, wherein the machine-learned encoder model is trained by:

during a forward pass, computing a loss by $\ell$ (h(y+u)) for a sampled instance u; and during a backward pass, replacing the derivative $$\frac{\partial}{\partial y_i} h(y_i + u_i)$$

with its expected value, $f(y_i+0.5)-f(y_i-0.5)$.

12. The computer-implemented method of claim 1, wherein the encoder model is trained using a training loss, wherein the training loss comprises a sum over all values of an expected value of a logarithm of a probability of the sum of the input data and a corresponding uniform random variable and the expected value of a decoder model.

13. A computer-implemented method of decoding encoded data, the method comprising:

obtaining, by a computing system comprising one or more computing devices, encoded data, the encoded data encoded based at least in part on input data and added noise from a noisy channel, wherein the encoded data is encoded by additively combining the added noise and the input data to obtain noisy input data and rounding the noisy input data by a soft rounding function, the soft rounding function having a sharpness, to produce the encoded data; and applying, by the computing system, a reconstruction defined by an expected value given a smooth universal quantization approximation to reconstruct approximated input data.

14. The computer-implemented method of claim 13, wherein a gradient of the approximated input data is computed without any loss by a distortion term including an expected value of a derivative of a loss function.

15. The computer-implemented method of claim 13, the encoded data encoded by a machine-learned encoder model trained on training data, wherein the training data is encoded with the added noise from the noisy channel.

16. A computer-implemented method of encoding input data with improved computational and statistical efficiency, the method comprising:

obtaining, by a computing system comprising one or more computing devices, input data associated with the computing system;

obtaining, by the computing system, data indicative of a target distribution based at least in part on the input data;

determining, by the computing system, a uniform distribution based at least in part on the target distribution;

obtaining, by the computing system, a plurality of samples from the uniform distribution;

identifying, by the computing system, an index corresponding to a selected sample of the plurality of samples from the uniform distribution such that the selected sample is distributed according to the target distribution; and communicating, by the computing system, encoded sample representation data, the encoded sample representation data comprising the index corresponding to the selected sample and a decoding factor comprising a subtractive combination of the selected sample and a uniform random variable corresponding to the selected sample.

17. The computer-implemented method of claim 16, wherein the input data comprises parameters of a machine-learned model, and wherein the target distribution comprises a distribution of the parameters of the machine-learned model.

18. The computer-implemented method of claim 16, wherein a support of the uniform distribution is at least equal to a support of the target distribution.

19. The computer-implemented method of claim 16, wherein identifying, by the computing system, the index corresponding to the selected sample of the plurality of samples comprises:

iteratively scoring, for at least one sample of the plurality of samples, the sample based at least in part on the target distribution; and selecting the sample as the selected sample if a score of the sample is less than or equal to a target score, the target score comprising an exponential sum of the indices of the plurality of samples divided by a maximum value of the target distribution.

20. The computer-implemented method of claim 16, wherein the selected sample is transformed to a multiplication of the index and a cumulative density function of a marginal distribution of the selected sample and a width of the target distribution.

21. A computing system, comprising:

one or more processors; and one or more non-transitory computer-readable media storing instructions that, when executed by the one or more processors, cause the computing system to perform operations, the operations comprising:

obtaining input data associated with the computing system; and encoding the input data and added noise from a noisy channel to produce encoded data based at least in part on a machine-learned encoder model, wherein encoding the input data and added noise comprises additively combining the added noise and the input data to obtain noisy input data and rounding the noisy input data by a soft rounding function, the soft rounding function having a sharpness, to produce the encoded data;

wherein the machine-learned encoder model is trained on training data, wherein the training data is encoded with the added noise from the noisy channel.

22. The computing system of claim 21, wherein the sharpness is progressively increased during training of the machine-learned encoder model.

23. The computing system of claim 21, wherein the soft rounding function comprises, in response to an input, a sum of a rounded input and a ratio of a hyperbolic tangent of the sharpness multiplied by a quantizing factor to a hyperbolic tangent of half of the sharpness.

24. The computing system of claim 21, wherein the input data comprises image data.

25. The computing system of claim 21, wherein the noisy channel is differentiable.

26. The computing system of claim 21, wherein the noisy input data is quantized by adding uniform noise during training of the machine-learned encoder model and during inference by the machine-learned encoder model by universal quantization.

27. One or more non-transitory computer-readable media storing instructions that, when executed by one or more processors, cause a computing system to perform operations, the operations comprising:

obtaining input data associated with the computing system; and encoding the input data and added noise from a noisy channel to produce encoded data based at least in part on a machine-learned encoder model, wherein encoding the input data and added noise comprises additively combining the added noise and the input data to obtain noisy input data and rounding the noisy input data by a soft rounding function, the soft rounding function having a sharpness, to produce the encoded data;

wherein the machine-learned encoder model is trained on training data, wherein the training data is encoded with the added noise from the noisy channel.

28. The one or more non-transitory computer-readable media of claim 27, wherein the sharpness is progressively increased during training of the machine-learned encoder model.

29. The one or more non-transitory computer-readable media of claim 28, wherein the soft rounding function comprises, in response to an input, a sum of a rounded input and a ratio of a hyperbolic tangent of the sharpness multiplied by a quantizing factor to a hyperbolic tangent of half of the sharpness.

30. The one or more non-transitory computer-readable media of claim 28, wherein the input data comprises image data.

31. The one or more non-transitory computer-readable media of claim 28, wherein the noisy channel is differentiable.

32. The one or more non-transitory computer-readable media of claim 28, wherein the noisy input data is quantized by adding uniform noise during training of the machine-learned encoder model and during inference by the machine-learned encoder model by universal quantization.

33. A computing system, comprising:
one or more processors; and
one or more non-transitory computer-readable media storing instructions that, when executed by the one or more processors, cause the computing system to perform operations, the operations comprising:
obtaining encoded data, the encoded data encoded based at least in part on input data and added noise from a noisy channel, wherein the encoded data is encoded by additively combining the added noise and the input data to obtain noisy input data and rounding the noisy input data by a soft rounding function, the soft rounding function having a sharpness, to produce the encoded data; and
applying a reconstruction defined by an expected value given a smooth universal quantization approximation to reconstruct approximated input data.

34. The computing system of claim 33, wherein a gradient of the approximated input data is computed without any loss by a distortion term including an expected value of a derivative of a loss function.

35. The computing system of claim 33, the encoded data encoded by a machine-learned encoder model trained on training data, wherein the training data is encoded with the added noise from the noisy channel.

36. One or more non-transitory computer-readable media storing instructions that, when executed by one or more processors, cause a computing system to perform operations, the operations comprising:
obtaining encoded data, the encoded data encoded based at least in part on input data and added noise from a noisy channel, wherein the encoded data is encoded by additively combining the added noise and the input data to obtain noisy input data and rounding the noisy input data by a soft rounding function, the soft rounding function having a sharpness, to produce the encoded data; and
applying a reconstruction defined by an expected value given a smooth universal quantization approximation to reconstruct approximated input data.

37. The one or more non-transitory computer-readable media of claim 36, wherein a gradient of the approximated input data is computed without any loss by a distortion term including an expected value of a derivative of a loss function.

38. The one or more non-transitory computer-readable media of claim 36, the encoded data encoded by a machine-learned encoder model trained on training data, wherein the training data is encoded with the added noise from the noisy channel.

39. A computing system, comprising:
one or more processors; and
one or more non-transitory computer-readable media storing instructions that, when executed by the one or more processors, cause the computing system to perform operations, the operations comprising:
obtaining input data associated with the computing system;
obtaining data indicative of a target distribution based at least in part on the input data;
determining a uniform distribution based at least in part on the target distribution;
obtaining a plurality of samples from the uniform distribution;
identifying an index corresponding to a selected sample of the plurality of samples from the uniform distribution such that the selected sample is distributed according to the target distribution; and
communicating encoded sample representation data, the encoded sample representation data comprising the index corresponding to the selected sample and a decoding factor comprising a subtractive combination of the selected sample and a uniform random variable corresponding to the selected sample.

40. The computing system of claim 39, wherein the input data comprises parameters of a machine-learned model, and wherein the target distribution comprises a distribution of the parameters of the machine-learned model.

41. One or more non-transitory computer-readable media storing instructions that, when executed by one or more processors, cause a computing system to perform operations, the operations comprising:
obtaining input data associated with the computing system;
obtaining data indicative of a target distribution based at least in part on the input data;
determining a uniform distribution based at least in part on the target distribution;
obtaining a plurality of samples from the uniform distribution;
identifying an index corresponding to a selected sample of the plurality of samples from the uniform distribution such that the selected sample is distributed according to the target distribution; and
communicating encoded sample representation data, the encoded sample representation data comprising the index corresponding to the selected sample and a decoding factor comprising a subtractive combination of the selected sample and a uniform random variable corresponding to the selected sample.

42. The one or more non-transitory computer-readable media of claim 41, wherein the input data comprises parameters of a machine-learned model, and wherein the target distribution comprises a distribution of the parameters of the machine-learned model.

\* \* \* \* \*